(12) United States Patent
Haga

(10) Patent No.: US 7,006,068 B2
(45) Date of Patent: Feb. 28, 2006

(54) SAMPLING LEVEL CONVERTER CIRCUIT, 2-PHASE AND MULTIPHASE EXPANDING CIRCUIT, AND DISPLAY DEVICE

(75) Inventor: Hiroshi Haga, Tokyo (JP)

(73) Assignee: NEC Corporation, Tokyo (JP)

( * ) Notice: Subject to any disclaimer, the term of this patent is extended or adjusted under 35 U.S.C. 154(b) by 156 days.

(21) Appl. No.: 10/253,974

(22) Filed: Sep. 25, 2002

(65) Prior Publication Data

US 2003/0076149 A1   Apr. 24, 2003

(30) Foreign Application Priority Data

Oct. 3, 2001 (JP) ............................. 2001-307397

(51) Int. Cl.
*G09G 3/36* (2006.01)

(52) U.S. Cl. .......................... 345/98; 345/99
(58) Field of Classification Search ........... 345/98–100
See application file for complete search history.

(56) References Cited

U.S. PATENT DOCUMENTS

| | | | | |
|---|---|---|---|---|
| 3,617,767 A | * | 11/1971 | Booher | 326/96 |
| 6,064,364 A | * | 5/2000 | Katoh et al. | 345/100 |
| 6,081,131 A | * | 6/2000 | Ishii | 326/68 |
| 6,236,256 B1 | | 5/2001 | Brownlow et al. | |
| 2001/0011987 A1 | * | 8/2001 | Kubota et al. | 345/98 |
| 2002/0030648 A1 | * | 3/2002 | Yamamoto et al. | 345/87 |

FOREIGN PATENT DOCUMENTS

| | | |
|---|---|---|
| CN | 1080077 A | 12/1993 |
| JP | 2-37823 A | 2/1990 |
| JP | 2-291719 A | 12/1990 |
| JP | 4-268818 A | 9/1992 |
| JP | 4-284021 A | 10/1992 |
| JP | 6-164365 A | 6/1994 |

OTHER PUBLICATIONS

Yoshiharu Nakajima et al., "TA 11.5—A 3.8inch QVGA Reflective Color LCD with Integrated 3b DAC Driver", *ISSCC 2000*, Section 11, 2000 IEEE International Solid-State Circuits Conference, 2000, pp. 188-189.

* cited by examiner

Primary Examiner—Kent Chang
(74) Attorney, Agent, or Firm—Sughrue Mion, PLLC

(57) ABSTRACT

A sampling level converter circuit having a fewer number of terminals and reduced power consumption, as well as an expanding circuit having such a sampling level converter circuit. The sampling level converter circuit includes first to third MOS transistors connected serially between a higher-potential power-supply and a lower-potential power-supply, a first capacitor connected to a connection node of the first and second MOS transistors, a fourth MOS transistor connected between an input terminal and the gate terminal of the third MOS transistor and a second capacitor connected to the gate of the third MOS transistor. A sampling pulse signal is supplied to the gates of the first and second MOS transistors, and a signal obtained by inverting this sampling pulse signal is supplied to the gate of the fourth MOS transistor.

37 Claims, 29 Drawing Sheets

SMP=L: SETUP INTERVAL

C1: CHARGED TO SIGNAL POTENTIAL
C2: PRECHARGED TO 10V

SMP=H: OUTPUT INTERVAL

C1: HOLDS SIGNAL POTENTIAL
C2: HOLDS OR DISCHARGES 10V PRECHARGE

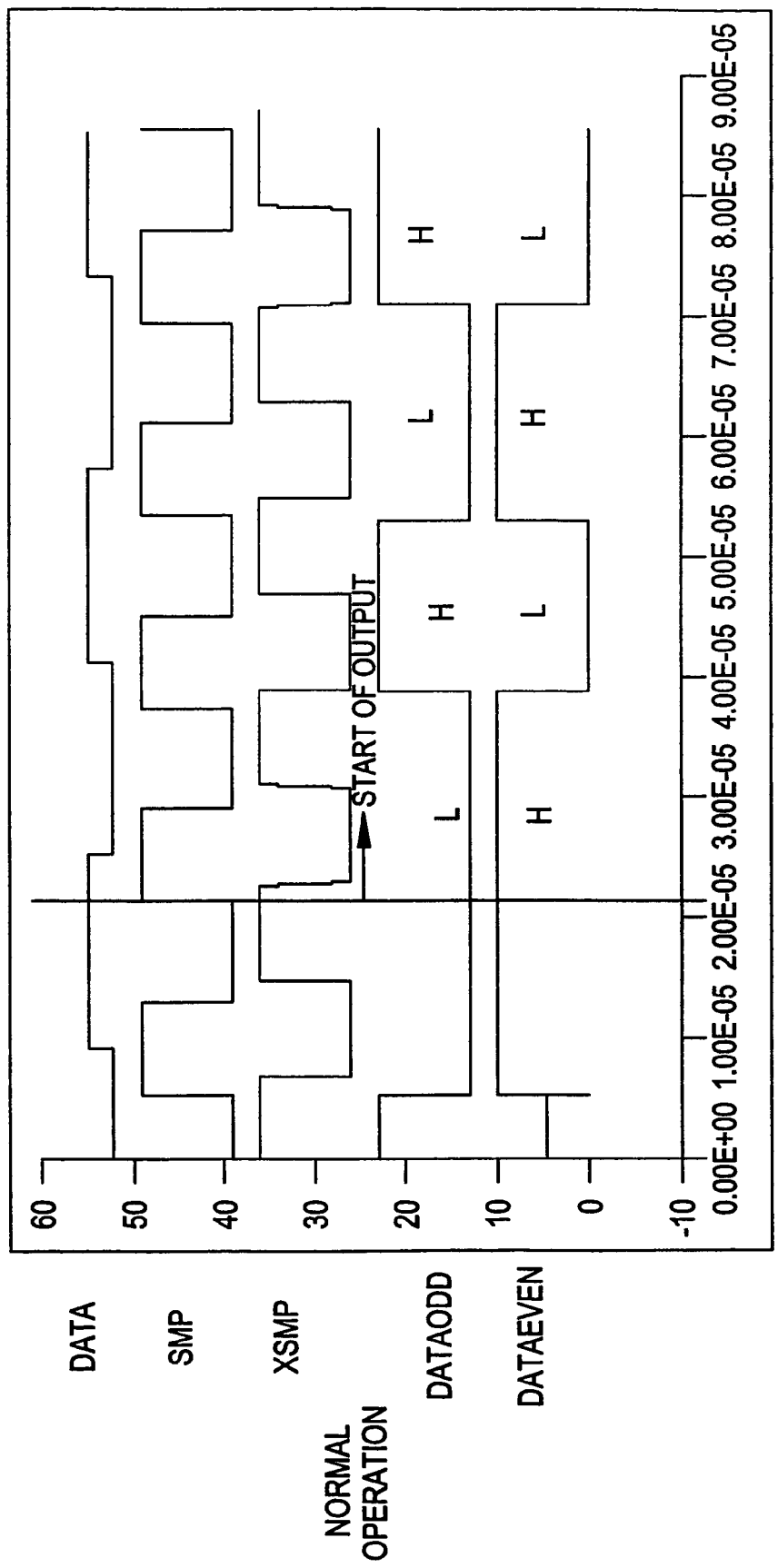

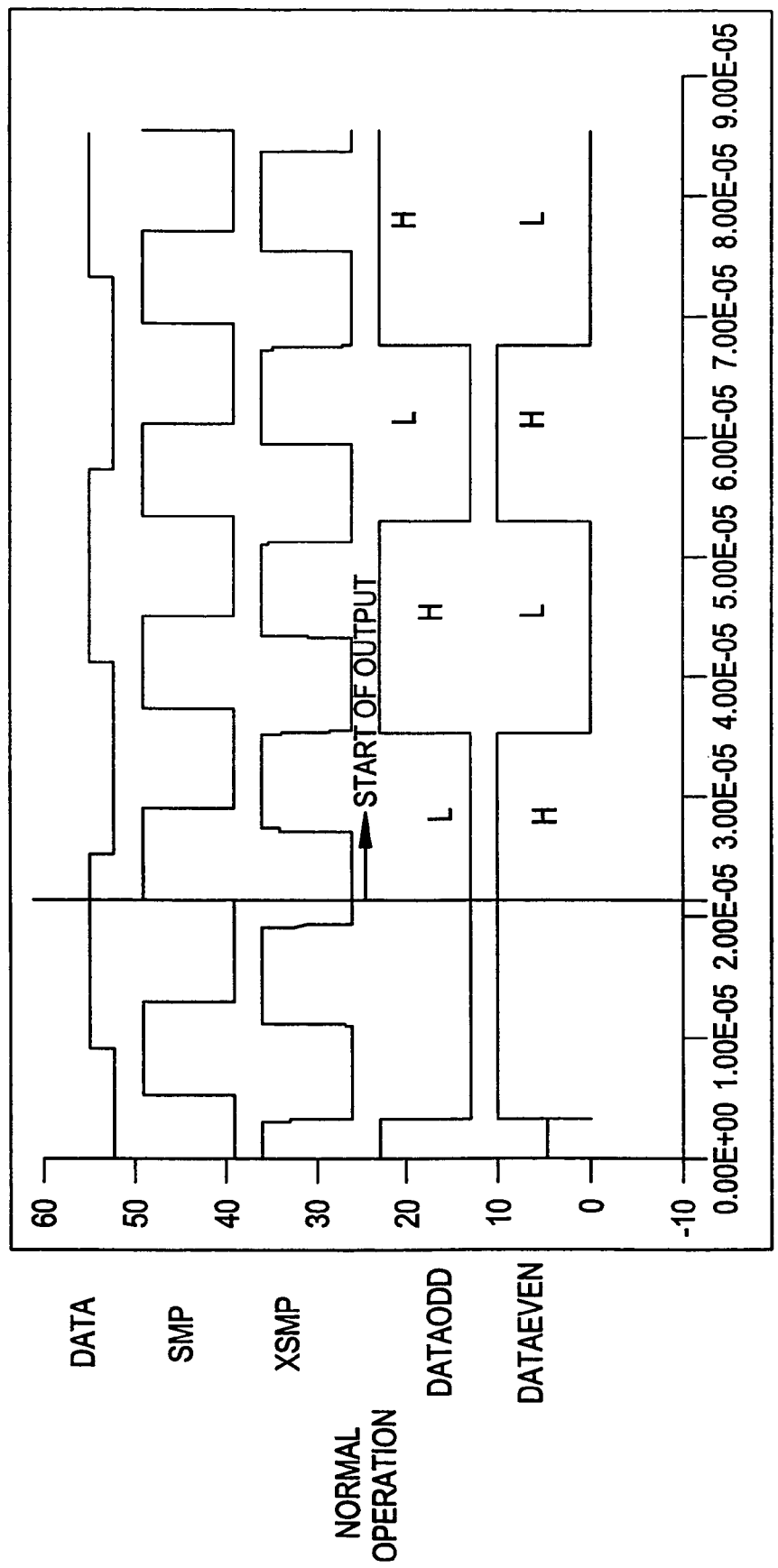

SAMPLING LEVEL CONVERTER CIRCUIT, 2-PHASE AND MULTIPHASE EXPANDING CIRCUIT, AND DISPLAY DEVICE

FIELD OF THE INVENTION

This invention relates to a level converter circuit. The invention further relates to a sampling level converter suited for use in display devices such as a liquid crystal display device or electroluminescence (EL) display device, and to an expanding circuit equipped with the sampling level converter.

BACKGROUND OF THE INVENTION

In order to obtain liquid crystal display devices of smaller size, lower cost and higher resolution(definition), the development of techniques for integrating circuits provided within a liquid crystal display device (module) on the same substrate as that of the liquid crystal display substrate is proceeding apace. In one example known in the art, a driver circuit made up of polysilicon thin-film transistors (abbreviated below as "polysilicon TFT" or "p-Si TFT") is integrated on a liquid crystal substrate. One example of a method of forming a film of polysilicon TFT on a glass substrate or the like at low temperatures is to build up a precursor film under reduced pressure or by plasma CVD (Chemical Vapor Deposition) and subjecting the film to polycrystallization by laser annealing. A polysilicon TFT has a higher mobility than an amorphous silicon TFT, enables the integration of some peripheral circuitry such as a data line driver circuit and makes it possible to realize a reduction in the number of driver LSI elements and a reduction in packaging cost. In regard to a data line driver circuit, a liquid crystal display substrate realized in the art has a mounted digital/analog converter (DAC) for converting digital display data to an analog signal.

The video signal that is supplied to a liquid crystal substrate having a mounted DAC is a digital signal. The signal usually is produced by a signal processing circuit (referred to as an "external signal processing circuit") provided externally of the liquid crystal display substrate.

Ordinarily this external signal processing circuit is constituted by a monocrystalline silicon CMOS (Complementary MOS) integrated circuit in which the driving voltage usually is lower than the power-supply voltage that is used to drive a polysilicon TFT. For example, the external signal processing circuit operates at a power-supply voltage of 3.3 V, whereas the polysilicon TFT requires a power-supply voltage on the order of 10 V in order to drive the liquid crystal display substrate at a satisfactory speed or in order to apply a satisfactory voltage to the liquid crystal. To achieve this, an arrangement is adopted in which the logic signal of 3.3 V is boosted to 10 V by a level converter circuit integrated with the liquid crystal display substrate.

The critical circuit element in such an implementation is the level converter circuit, which serves as the interfacing circuit between the external signal processing circuit and the polysilicon TFT.

Several implementations of level converter circuits according to the prior art will be described.

FIGS. 24A and 24B illustrate two examples of conventional level converter circuits having a crisscross arrangement. Referring to FIG. 24A, this level converter circuit includes P-channel MOS transistors MP1 and MP2 whose sources are connected to a power-supply VDD, and N-channel MOS transistors MN1 and MN2 whose sources are tied together and connected to a power-supply VSS and whose drains are connected to the drains of the P-channel MOS transistors MP1 and MP2, respectively. The drains of the N-channel MOS transistors MN1 and MN2 are cross-cross-connected to gates of the P-channel MOS transistors MP2 and MP1, respectively. Complementary input signals IN and INB are applied to the gates of the N-channel MOS transistors MN1 and MN2, respectively, and an output is extracted from the drain of the N-channel MOS transistor MN1.

In the arrangement shown in FIG. 24B, the gates of P-channel MOS transistors MP3 and MP4 whose sources are connected to a power-supply are cross-connected to the outputs of a second CMOS inverter (MP2 and MN2) and a first CMOS inverter (MP1 and MN1), respectively, to which complementary input signals VIN and VINB, respectively, are connected.

For a description of such cross-connected arrangements, refer to the specifications of Japanese Patent Kokai Publication Nos. 02-37823, 04-268818, 02-291719 and 04-284021.

Since there is no steady current (current is on the order of leakage current, where the gate-source voltage VGS of the transistors is 0 V) in the steady state in the above-described cross-connection arrangements, power consumption is low. However, two inputs, namely IN and its inverted counterpart (complementary signal) INB, are necessary for a signal of a single type. Consequently, when a connection is made to a data bus for which the data bit width exceeds 100 bits, for example, twice the number of terminals are required for the cross-connected level converter circuit. The problem that arises is a large number of connections (contacts) for these numerous terminals.

FIG. 25A illustrates the structure of a level converter circuit of constant-current load (source-grounded amplifying circuit) type. In this level converter circuit, an input signal is applied to the gate of a source-grounded N-channel MOS transistor MN1, the drain of the MOS transistor MN1 is connected to a constant-current load and an output OUT is extracted from the drain of the MOS transistor MN1. This is a single-input arrangement, where the only input is IN, though a steady current flows from the power-supply on the side of the high potential to that on the side of the low potential. If a number of such levels converting circuits mounted, therefore, the amount of power consumed increases.

FIG. 25B is a diagram illustrating an inverter-type level converter circuit. This arrangement is constituted by a CMOS inverter (MP1, MN1) (left side) or by a CMOS inverter (MP1, MN1) and a drain-and-gate connected (diode-connected) N-channel MOS transistor MN2 provided between the CMOS inverter (MP1, MN1) and a high-potential power-supply VDD (right side).

FIG. 25C illustrates the structure of a level converter circuit disclosed in the specification of Japanese Patent Kokai Publication No. 06-164365. In this arrangement, a first driving transistor mn1 and a first load transistor mp1 are connected in series with each other via an intermediate node A, and a second driving transistor mn2 and a second load transistor mp2 are connected in series with each other via an intermediate node B. The first transistor mn1 operates in response to a low-amplitude, single-phase input clock pulse φ, inhibits operation of the second load transistor mp2 and renders the second driving transistor mn2 conductive, thereby causing an output clock pulse Q having the high amplitude VDD to be produced at an output node B. With removal of the single-phase input pulse, a complementary transistor mp3 restores the second driving transistor mn2 via the intermediate node A and cuts off the second load transistor mp2, thereby producing the output clock pulse.

Further, IEEE, ISSCC2000, DIGEST OF TECHNICAL PAPERS, pp. 188–189, discloses a level shift and latch circuit (a sampling latch), which has a low power consumption and a small number of elements, mounted on an LCD (Liquid Crystal Display) having an internal DAC, as depicted in FIG. 26. This circuit arrangement is the same as that of a latch-type sensing amplifier used by a memory and has its input terminal DC-connected to a higher-potential power-supply (VDD; 9 V) via a switch. As a result, there is the possibility that a high voltage will be applied to the input terminal. In order to assure that the circuit on the low-voltage side connected to the input terminal will not be destroyed, therefore, it is necessary to design proper switch timing.

In level converter circuits having arrangements other than those described above, e.g., arrangements based upon circuits using a differential pair, there are instances where an idling current is necessary or where a separate power-supply for operating the level converter circuit is required.

SUMMARY OF THE DISCLOSURE

If a sampling level converter circuit for sampling an input signal and outputting a signal that has undergone a level conversion is to be mounted on an LCD module, the following specifications are required:
one input terminal for one type of input signal;
low power consumption (zero steady current: on the order of off-leakage current);
being able to design a circuit that will operate at a voltage on the order of a TFT threshold value, with an input signal amplitude of 0 to 3 V; and
no additional power-supply required.

Accordingly, it is an object of the present invention to provide a level converter circuit having a fewer number of terminals and reduced power consumption, as well as a 2-phase and multiphase expanding circuit having such a level converter circuit.

In accordance with one aspect of the present invention, the foregoing object is attained by providing a sampling level converter circuit comprising: means for turning on a switch element, which has been inserted into a charging path of an output node, in a setup time-interval on the basis of a sampling control signal input thereto, thereby pre-charging the output node to a voltage of the higher-potential power-supply; and means for sampling an input signal voltage; wherein a discharging path of the output node is held in an off state based upon the entered sampling control signal in the setup time-interval, a switch element that has been inserted into a discharging path of the output node is turned on or off in accordance with a logic value of the input signal voltage, which has been sampled in the setup time-interval, in an output time-interval decided by the entered sampling control signal, the discharging path is turned on, whereby discharging of the precharged output node is performed, when the switch element inserted into the discharging path is turned on, and the precharged output node is not discharged when the switch element inserted into the discharging path is turned off.

A level converter circuit in accordance with one aspect of the present invention comprises first to third switch elements connected serially between a higher-potential power-supply and a lower-potential power-supply; a first capacitor connected to a connection node of the first and second switch elements; a fourth switch element connected between an input terminal, to which an input signal is supplied, and a control terminal of the third switch element; and a second capacitor connected to a connection node of the control terminal of the third switch element and the fourth switch element; wherein a first sampling control signal is supplied to both a control terminal of the first switch element and a control terminal of the second switch element; the first switch element is turned on, the second switch element is turned off and the first capacitor is charged to the voltage of the higher-potential power-supply when the first sampling control signal is a second logic value; a second sampling control signal is supplied to a control terminal of the fourth switch element; the fourth switch element is turned on and the second capacitor is charged to voltage of the input signal when the second sampling control signal is a first logic value; the first switch element is turned off and the second switch element is turned on when the first sampling control signal is the first logic value; and terminal voltage of the first capacitor prevailing at this time is extracted as an output signal directly or indirectly.

There is provided a 2-phase expanding circuit, in accordance with another aspect of the present invention, comprising first and second sampling level converter circuits each constituted by a sampling level converter circuit according the invention described above, wherein an input signal is applied commonly to both the first and second sampling level converter circuits; signals of values obtained by inverting values of first and second sampling control signals of the first sampling level converter circuit are input to respective ones of corresponding switch elements in the second sampling level converter circuit; the 2-phase expanding circuit further comprises a first master/slave latch, in which an output signal of the first sampling level converter circuit is loaded based upon the first sampling control signal, for outputting this signal based upon the second sampling control signal; a latch for delivering the output signal of the first master/slave latch based upon the first sampling control signal; and a second master/slave latch, in which an output signal of the second sampling level converter circuit is loaded based upon the second sampling control signal, for outputting this signal based upon the first sampling control signal.

In a further aspect of the present invention, there is provided a display device that includes a display panel having a display section in which pixels are arrayed in the form of matrix at cross points of a plurality of data lines and a plurality of scanning lines, a scanning-line driver circuit for applying voltage sequentially to the plurality of scanning lines, and a data-line driver circuit, which receives display data from a host device, for applying voltage corresponding to the display data to the plurality of data lines, the display device comprising: a display memory, which is provided externally of the display panel, for storing the display data; and a controller, which is provided externally of the display panel, for controlling for controlling the display memory as well as communication with the host device; the display panel having a sampling level converter circuit according to the above-described invention as a level converter circuit, which receives display data transferred from the display memory, for level-converting this data to a signal having a higher amplitude.

In a further aspect of the present invention, the display panel in the display device according to the present invention has a 2-phase expanding circuit according to the above-described invention as a circuit, which receives display data transferred from the display memory, for level-converting this data to a signal having a higher amplitude.

In yet another aspect of the present invention, there is provided an n-phase expanding circuit having n-number (where n is a predetermined positive integer equal to or greater than 2) of the above-described sampling level converter circuits; a data signal line is connected in common with the input terminals of each of the n-number of sampling level converter circuits; a circuit is provided for generating multiphase clock signals in which mutually adjacent phases are spaced apart from each other by one data cycle; an i-th (where i is an integer equal to or greater than 1 and less than n) clock signal of the multiphase clock signals is supplied as the second sampling control signal of an i-th sampling level converter circuit and an (i+1)th clock signal of the multiphase clock signals is supplied as the first sampling control signal; there are provided n-number of first latch circuits to correspond to respective ones of the sampling level converter circuits, the first latch circuit receiving a terminal voltage of the first capacitor of the i-th sampling level converter circuit, delivering this voltage at a transition to a first logic value of the (i+1)th clock signal and storing this voltage at a second logic value of the (i+1)th clock signal; and there are provided n-number of second latch circuits, to which outputs of respective ones of the first latch circuits are input, for receiving in common a latch timing signal having a cycle obtained by frequency-dividing the data cycle by n, and latching and outputting outputs of the first latch circuits.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 13A and 13B are diagrams useful in describing design of a sampling level converter circuit according to an embodiment of the present invention, in which FIG. 13A is a graph illustrating the discharge characteristic of a pre-charging capacitor and the result of simulating a charging/discharging characteristic of a sampling capacitor;

FIGS. 15A and 15B are diagrams illustrating the result of a simulation in which operation that is free of clock skew in the 2-phase expanding circuit of the third embodiment has been confirmed;

PREFERRED EMBODIMENTS OF THE INVENTION

Preferred embodiments of the present invention will now be described.

Figure 1:
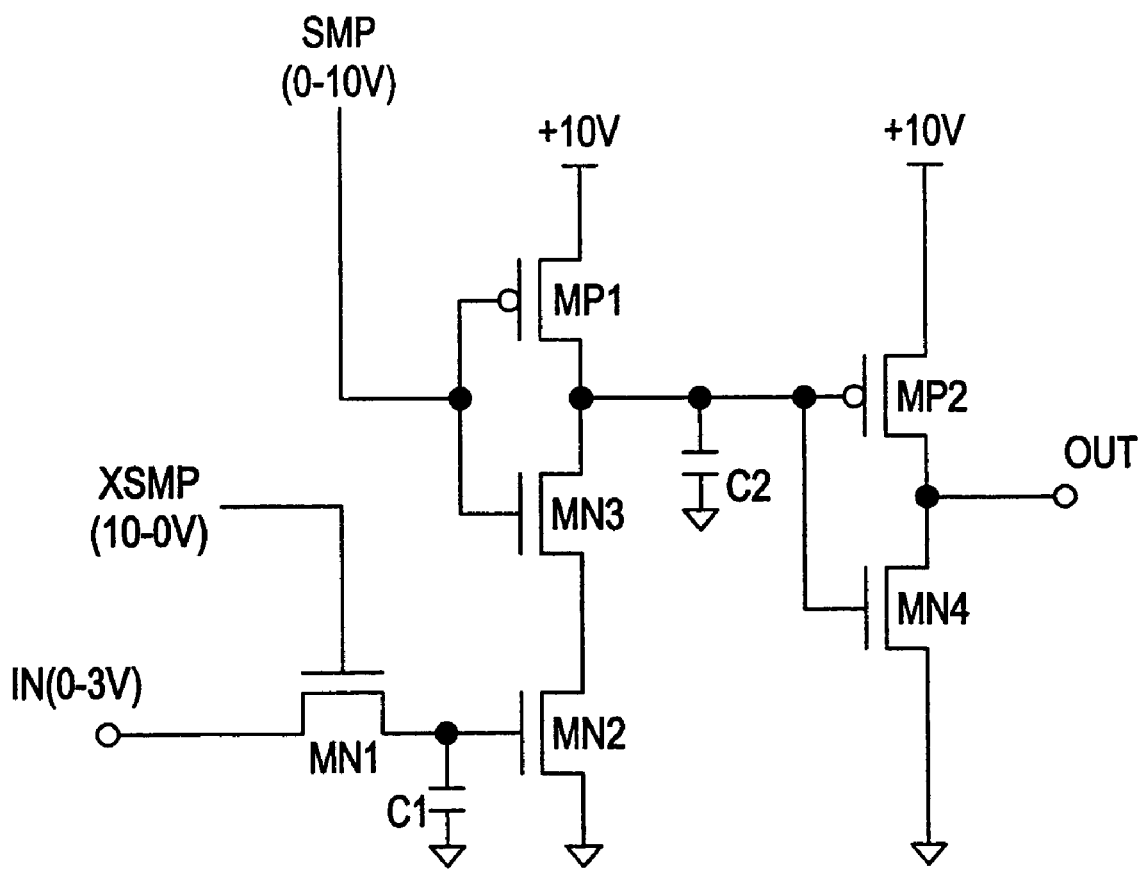
FIG. 1 is a diagram illustrating the structure of a sampling level converter circuit according to a first embodiment of the present invention.

In a first embodiment of the present invention, as shown in FIG. 1, a sampling level converter circuit includes means for turning on a switch element (transistor MP1 in FIG. 1), which has been inserted into a charging path (the path between a capacitor C2 and a higher-potential power-supply) of an output node, for a setup time-interval on the basis of sampling control signals (SMP, XSMP in FIG. 1) input thereto, thereby pre-charging the output node to the voltage of the higher-potential power-supply; and means (transistor MN1 and capacitor C1 in FIG. 1) for sampling an input signal voltage. The discharging path of the output node is set to an off (non-conductive) state (transistor MN3 in FIG. 2 is turned off) based upon the entered sampling control signal (SMP) in the setup time-interval. A switch element (a transistor MN2 in FIG. 1) that has been inserted into the discharging path of the output node is turned on or off in accordance with a logic value (the terminal voltage of the capacitor C1) of the input signal, which has been sampled in the setup time-interval, in an output time-interval that follows the setup time-interval. When the switch element (the transistor MN2 in FIG. 1) that has been inserted into the discharging path is turned on, the discharging path of the output node is turned on, thereby discharging the output node that has been precharged to the voltage of the higher-potential power-supply, based upon the entered sampling control signal (transistor MN3 in FIG. 1 is on). When the switch element (the transistor MN2 in FIG. 1) that has been inserted into the discharging path is turned off, the output node is not discharged and is kept at the voltage of the higher-potential power-supply to which it has been pre-charged.

More specifically, as shown in FIG. 1, the sampling level converter circuit includes first to third MOS transistors (MP1, MN3, and MN2) connected serially between the higher-potential power-supply and the lower-potential power-supply and constituting first to third switch elements, respectively; a capacitor (C2) connected to the node at which the first and second MOS transistors (MP1 and MN3) are connected together; a fourth MOS transistor (MN1 connected between the input terminal and the gate terminal of the third MOS transistor (MN2) and constituting a fourth switch element; and a capacitor (C1) connected to the gate of the third MOS transistor (MN2). The first sampling control signal (SMP) is supplied in common to the gates of both the first and second MOS transistors (MP1 and MN3), and the second sampling control signal (XSMP) is supplied to the gate of the fourth MOS transistor (MN1).

Operation of this circuit will now be described in brief. When the first sampling control signal (SMP) is a second logic value (i.e., in the setup time-interval), the MOS transistor (MP1) constituting the first switching element is turned on, the MOS transistor (MN3) constituting the second switch element is turned off and the capacitor (C2) is charged to the voltage of the higher-potential power-supply. When the second sampling control signal (XSMP) is a first logic value, the fourth transistor (MN1) constituting the fourth switch element is turned on and the capacitor (C1) is charged by the input signal voltage.

When the first sampling control signal (SMP) is the first logic value (i.e., in the output time-interval), the MOS transistor (MP1) constituting the first switch element is turned off and the MOS transistor (MN3) constituting the second switch element is turned on. The terminal voltage of the capacitor (C2) prevailing at this time is extracted as an output signal directly or indirectly. In this case, a signal (complementary signal) obtained by inverting the first sampling signal (SMP) is supplied as the second sampling control signal (XSMP).

In a case where the sampling level converter circuit according to the present invention is mounted on a display panel, the higher-potential power-supply is set to the power-supply on the side of the display panel and the lower-potential power-supply is set to a ground potential. The first MOS transistor MP1 is composed of a P-type TFT (Thin-Film Transistor), and the second to fourth MOS transistors MN3, MN2, and MN1 are composed of N-type TFTs.

Figure 21:
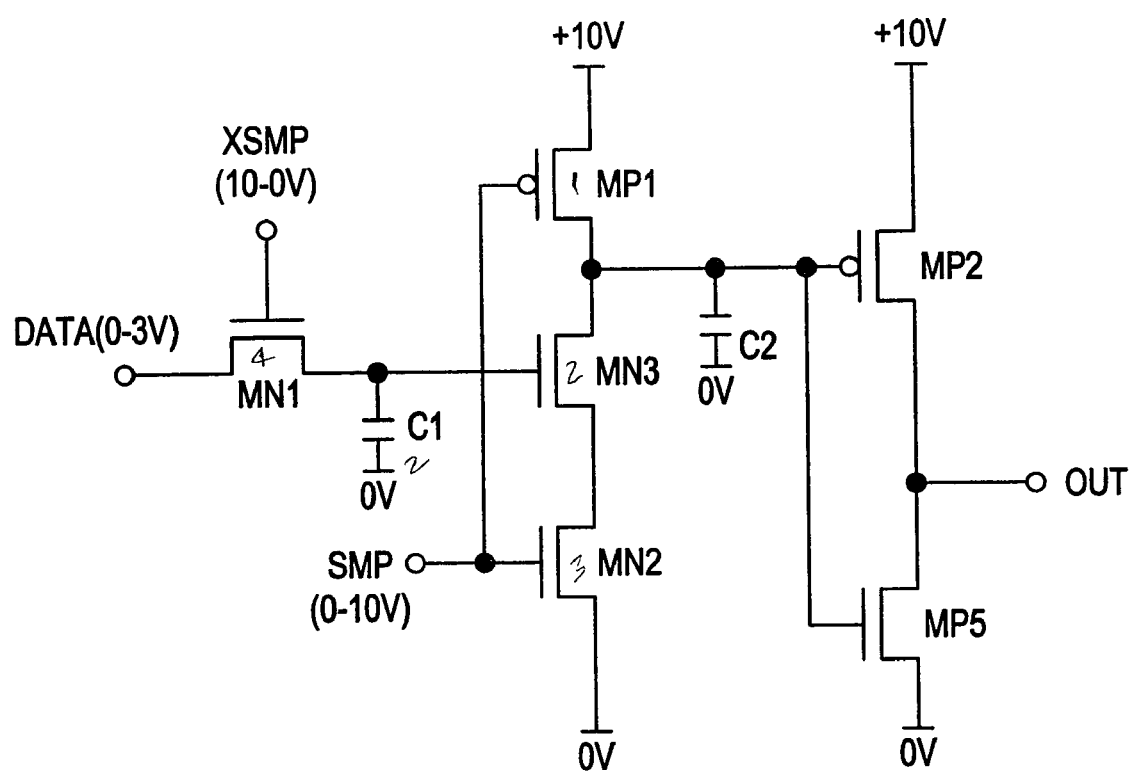
FIG. 21 is a diagram illustrating the structure of a sampling level converter circuit according to another embodiment of the present invention.

In another preferred embodiment of the present invention, as shown in FIG. 21, a sampling level converter circuit includes first to third MOS transistors (MP1, MN3 and MN2) connected serially between the higher-potential power-supply and the lower-potential power-supply and constituting first to third switch elements, respectively; a capacitor (C2) connected to the node at which the first and second MOS transistors (MP1 and MN3) are connected together; a fourth MOS transistor (MN1) connected between the input terminal and the gate terminal of a second MOS transistor (MN3) and constituting a fourth switch element; and a capacitor (C1) connected to the gate of the second MOS transistor (MN3). The first sampling control signal (SMP) is supplied in common the gates of both the first and third MOS transistors (MP1, MN2), and the second sampling control signal (XSMP) is supplied to the gate of the fourth MOS transistor (MN1). The operation of the sampling level converter circuit according to this embodiment basically is the same as that of the sampling level converter circuit of the embodiment set forth above. For example, if the logic amplitude voltage of the signal applied to the input terminal is sufficiently greater than the threshold voltage of the MOS transistors composing the sampling level converter circuit, then the sampling level converter circuit of this embodiment is suited for use. If the capacitor (C2) has the same capacitance, then, when the signal voltage applied to the input terminal is 0 V, the voltage drop due to redistribution of the charge of the capacitor (C2) will be suppressed so as to be less than that of the arrangement according to the above-described embodiment.

A sampling level converter circuit according to the present invention has the following advantages:

1. Low power consumption is attained because a steady current does not flow.

2. Owing to the single-phase input (meaning that inverted data is unnecessary), a smaller number of terminals suffice. In contrast with the present invention, a conventional level converter circuit requires two inputs, namely data and inverted data which is obtained by inverting the data.

3. A potential of the high voltage side is not produced at the input terminal and, hence, there is little possibility that the circuit on the low-voltage side will be destroyed. If a latch-type-sensing amplifier employed in a memory or the like is used in a level shifter, there are occasions where a potential on the high-voltage side appears at the input terminal.

In case of a polysilicon TFT LCD, the device can have as many as 200 data input terminals. The present invention is particularly effective when used in such an application that requires the sampling of numerous items of data as well as level shifting.

Figure 7:
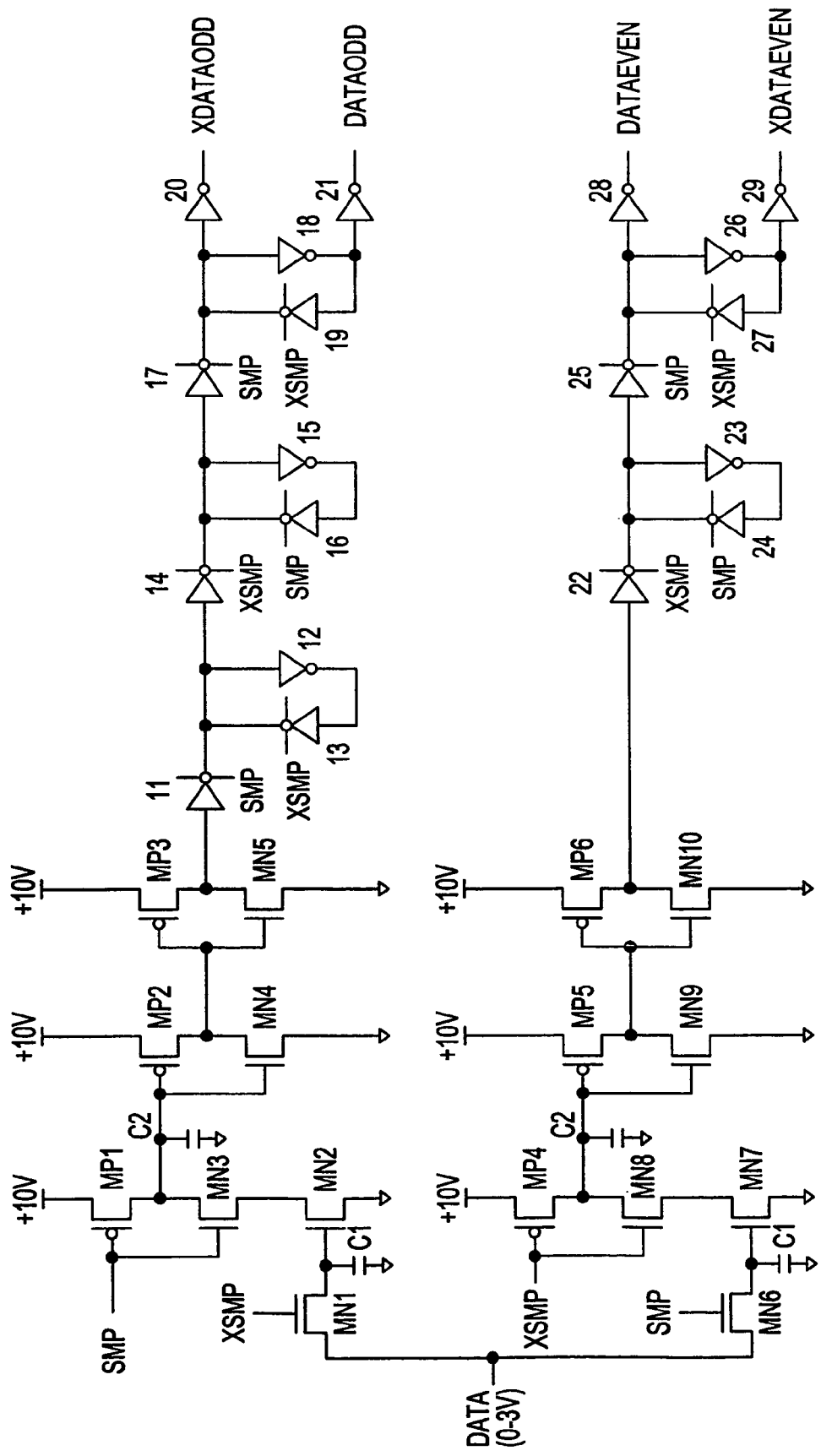
FIG. 7 is a diagram illustrating the structure of a 2-phase expanding circuit according to a third embodiment of the present invention.

As shown in FIG. 7, a 2-phase expanding circuit(serial to parallel converter) according to an embodiment of the present invention, comprises two of the sampling level converter circuits (referred to as first and second sampling level converter circuits) according to the embodiment described above. An input signal is applied commonly to both the first and second sampling level converter circuits. Signals (XSMP and SMP) that are of values obtained by inverting the values of the first and second sampling signals (SMP and XSMP) of the first and second sampling level converter circuits, respectively, are fed to respective ones of corresponding switch elements in the second sampling level converter circuit. The 2-phase expanding circuit further comprises a first master/slave latch, in which an output signal of the first sampling level converter circuit is sampled based upon the first sampling control signal (SMP), for outputting the sampled signal based upon the second sampling control signal (XSMP); a latch for delivering the output signal of the first master/slave latch based upon the first sampling control signal (SMP); and a second master/slave latch, in which an output signal of the second sampling level converter circuit is sampled based upon the second sampling control signal (XSMP), for outputting the sampled signal based upon the first sampling control signal (SMP). Odd- and even-numbered signals are output in parallel, in synchronization with the first sampling control signal (SMP), from the output of the latch that latches the output of the first master/slave latch and the output of the second master/slave latch, respectively.

Figure 16:
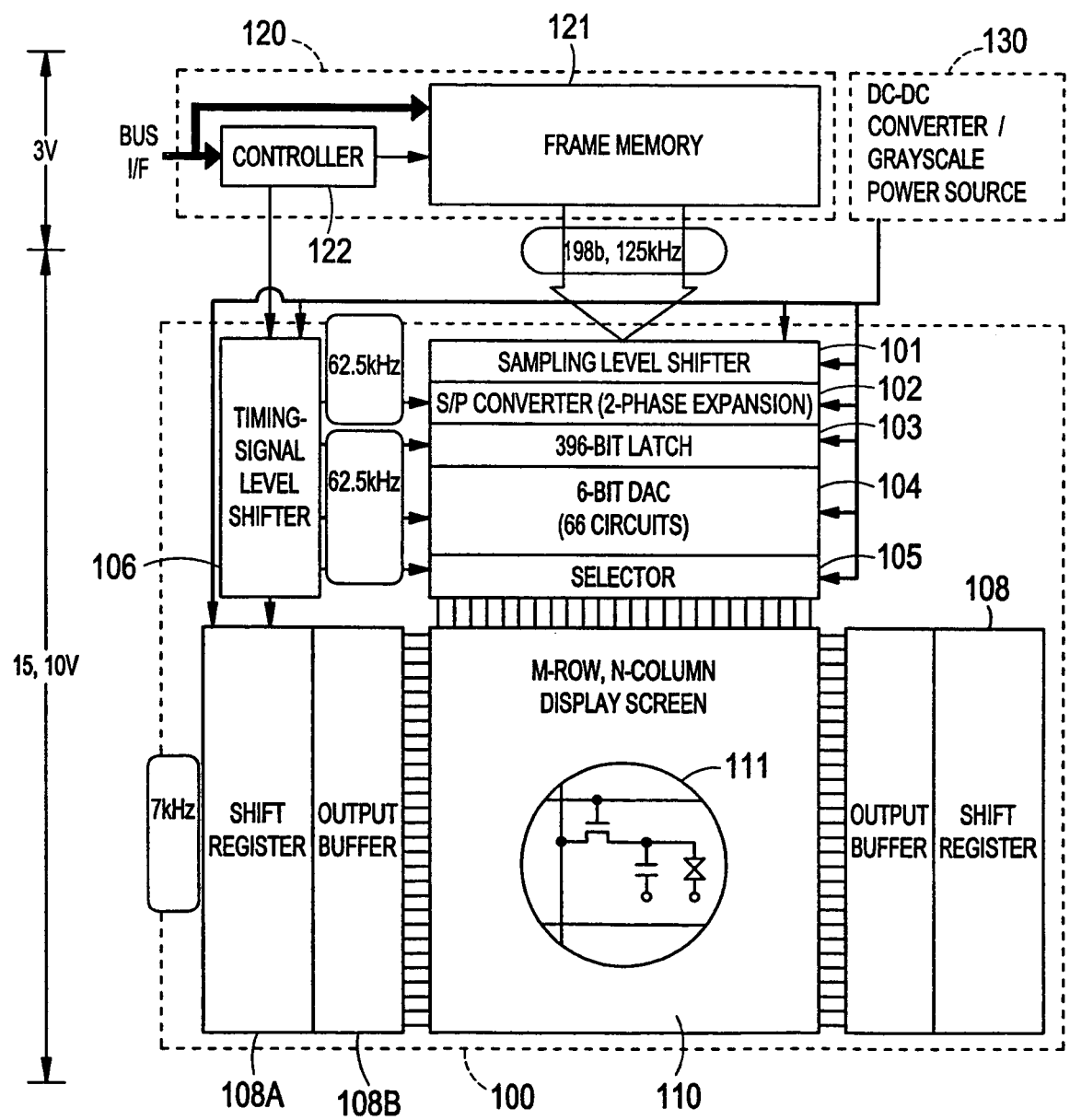
FIG. 16 is a diagram illustrating an example of the structure of a LCD having an internal DAC.

A display device according to an embodiment of the present invention, as shown in FIG. 16, includes a display panel (100) having a plurality of pixel units which are arranged in the form of matrix at cross points of a plurality of data lines and a plurality of scanning lines, a scanning-line driver circuit (referred to as a "scanning circuit") (108) for applying voltage sequentially to the plurality of scanning lines, and a data-line driver circuit, which receives display data from a host device, for applying voltage corresponding to the display data to the plurality of data lines. The display device comprises a display memory (121), which is provided externally of the display panel, for storing the display data on the pixel unit; and a controller (122), which is provided externally of the display panel, for controlling the display memory as well as for performing communication and control with the host device. A sampling level converter circuit according to the above-described invention is provided as a level converter circuit (101) on the display panel (display device substrate) (100). In the display device, the sampling level converter circuit according to the present invention is provided as the level converter circuit (101), which receives display data of a low-amplitude logic signal (e.g., 0 to 3 V) from the display memory(121), converts the display data to a high-amplitude logic signal (e.g., 0 to 10 V).

In this embodiment of the present invention, as shown in FIG. 16, the display device may be provided with a 2-phase expanding circuit according to the above-described invention as a circuit (102), which receives display data of the low-amplitude logic signal from the display memory (121), for level-converting this data to a high-amplitude logic signal and applying a 2-phase expansion. The output signal of the 2-phase expanding circuit is supplied to a digital/analog converter 104, which converts the signal to an analog video signal. An arrangement may be adopted in which a plurality of data lines are provided and output signals from the digital/analog converter are supplied to the data lines directly or upon being selected sequentially by a selector (105) to which the outputs of the digital/analog converter are input.

Another embodiment of a multiphase expanding circuit (n-phase expanding circuit) according to the present invention will now be described.

Figure 22:
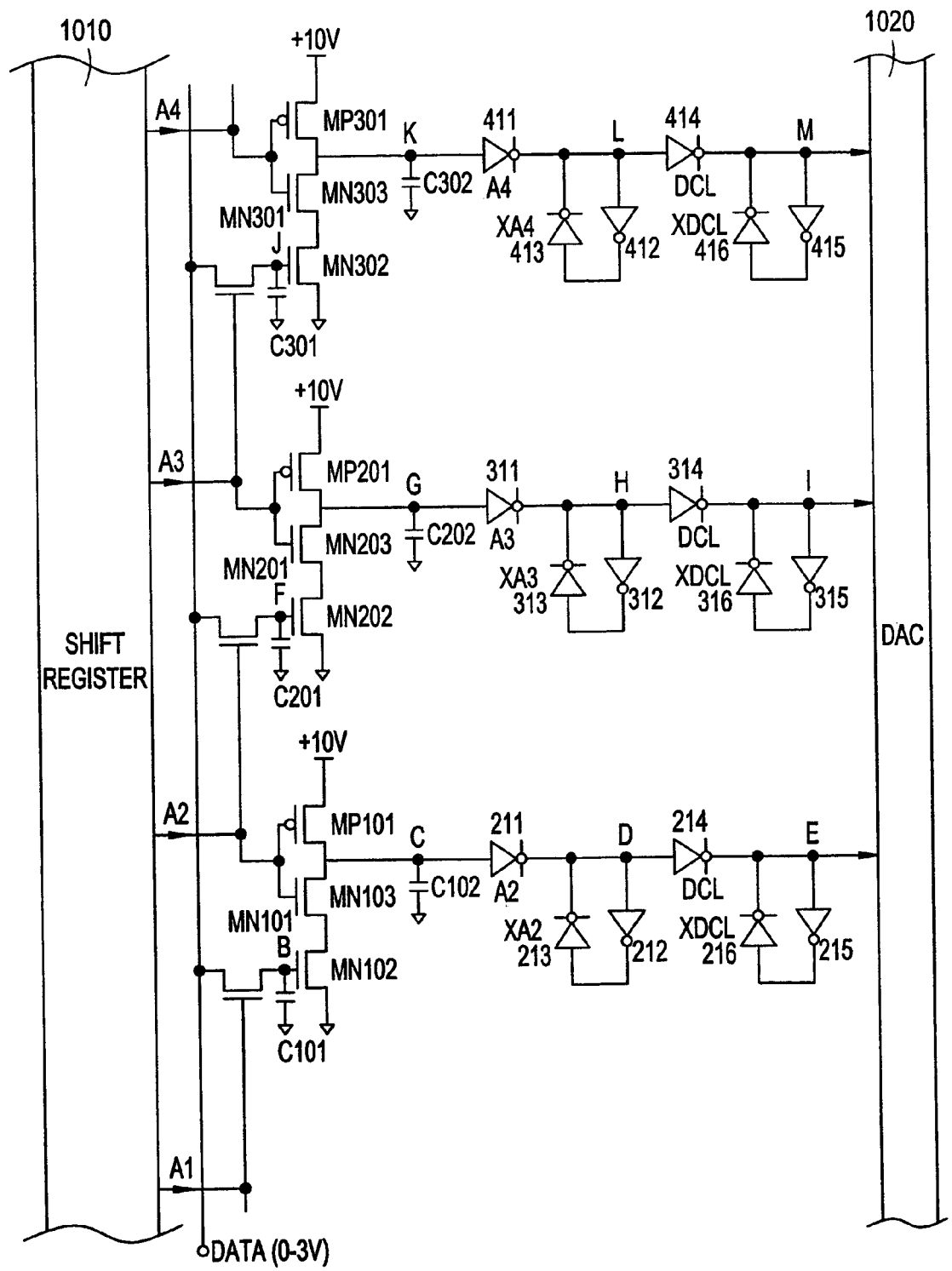
FIG. 22 is a diagram illustrating the structure of an n-phase expanding circuit according to another embodiment of the present invention.

As shown in FIG. 22, an n-phase expanding circuit according to the present invention is provided with n-number (where n is a predetermined positive integer equal to or greater than 2) of the sampling level converter circuits according to the present invention described above. A data signal line (DATA) is connected in common with the input terminals of each of the n-number of sampling level converter circuits, and a clock generating circuit is provided for generating multiphase clock signals in which mutually adjacent phases differ from each other by one data cycle. An i-th (where i is an integer equal to or greater than 1 and less than n) clock signal of the multiphase clock signals is supplied as the second sampling control signal (XSMP) of an i-th sampling level converter circuit and an (i+1)th clock signal of the multiphase clock signals is supplied as the first sampling control signal (SMP).

There are provided n-number of first latch circuits corresponding to respective ones of the sampling level converter circuits, each first latch circuit receiving the terminal voltage of a capacitor (C2) of the ii-th (i is an integer greater or equal to 1 and lesser or equal to n)-th sampling level converter circuit, and outputting this voltage at a transition to a first logic value of the (i+1)th clock signal. These first latch circuits are a latch circuit comprising a clocked inverter 211, an inverter 212 and a clocked inverter 213; a latch circuit comprising a clocked inverter 311, an inverter 312 and a clocked inverter 313; a latch circuit comprising a clocked inverter 411, an inverter 412 and a clocked inverter 413.

There are further provided n-number of second latch circuits, which receives outputs of respective ones of the first latch circuits for latching these signals at a latch timing signal of a cycle obtained by performing the frequency-division of the data cycle by n. These second latch circuits are a latch circuit comprising a clocked inverter 214, an inverter 215 and a clocked inverter 216; a latch circuit comprising a clocked inverter 314, an inverter 315 and a clocked inverter 316; a latch circuit comprising a clocked inverter 414, an inverter 415 and a clocked inverter 416; . . . . The n-number of second latch circuits output n bits in parallel and in synchronization with the latch timing signal. The circuit for generating the multiphase clock is constituted by a shift register (1010), which generates multiphase clock signals shifted from one another by one data cycle.

Embodiments of the present invention will now be described in detail with reference to the drawings. Described first will be an embodiment of a sampling level converter circuit according to the present invention.

FIG. 1 is a diagram illustrating the basic structure of a sampling level converter circuit according to this embodiment of the invention.

Referring to FIG. 1, the sampling level converter circuit of this embodiment samples input data having a voltage amplitude of 0 to 3 V to obtain level-converted data having a voltage amplitude of 0 to 10 V. More specifically, the sampling level converter circuit includes a P-channel MOS transistor MP1 having a source connected to a higher-potential power-supply (a power-supply voltage of 10 V), and an N-channel MOS transistor MN3 having a drain connected to the drain of the P-channel MOS transistor MP1 and a gate tied to the gate of the P-channel MOS transistor MP1. A sampling pulse signal SMP, which is a signal that controls the sampling operation, is supplied to both the gate of the P-channel MOS transistor MP1 and the gate of the N-channel MOS transistor MN3.

The sampling level converter circuit further includes an N-channel MOS transistor MN2 having a drain connected to the source of the N-channel MOS transistor MN3 and a source connected to a lower-potential power-supply (ground), and an N-channel MOS transistor MN1, which is connected between an input terminal IN to which input data (0 to 3 V) is applied and the gate of the N-channel MOS transistor MN2, and which has a gate to which is supplied a signal XSMP obtained by inverting the sampling pulse signal SMP.

The sampling level converter circuit is provided with a P-channel MOS transistor MP2 having a source connected to the higher-potential power-supply (10 V), and an N-channel MOS transistor MN4 having a drain connected to the drain of the P-channel MOS transistor MP2. The gate of the P-channel MOS transistor MP2 and the gate of the N-channel MOS transistor MN4 are tied together and are connected to the point at which the drain of the P-channel MOS transistor MP1 and the drain of the N-channel MOS transistor MN3 are connected together. The node at which the drain of the P-channel MOS transistor MP2 and the drain of the N-channel MOS transistor MN4 are connected together is connected to an output terminal OUT. The MOS transistors MP2 and MN4, which composes a CMOS inverter, receive the terminal voltage of capacitor C2 and output a binary signal having an amplitude of 0 to 10 V.

A capacitor C1 is connected between the gate of the N-channel MOS transistor MN2 and the lower-potential power-supply (ground), and the capacitor C2 is connected between the node at which the drain of the P-channel MOS transistor MP1 and the drain of the N-channel MOS transistor MN3 are connected together and the lower-potential power-supply (ground).

The N-channel MOS transistor MN1 and capacitor C1 compose a sampling circuit for sampling the input signal voltage applied to the input terminal. The P-channel MOS transistor MP1 functions as an element for pre-charging the capacitor C2, the N-channel MOS transistor MN2 as an element for detecting the input voltage and the N-channel MOS transistor MN3 as an element for evaluating the input voltage. According to the embodiment described below, these MOS transistors are constituted by polysilicon TFT elements fabricated on an insulating substrate (TFT substrate). It should be noted that parasitic capacitance at the node between the gate of N-channel MOS transistor MN2 and the N-channel MOS transistor MN1 may be used as the capacitor C1, and that parasitic capacitance at the node between the drain of P-channel MOS transistor MP1 and the drain of N-channel MOS transistor MN3 may be used as the capacitor C2.

The basic operation of the level converter circuit according to the first embodiment shown in FIG. 1 will now be described.

Figure 2A:
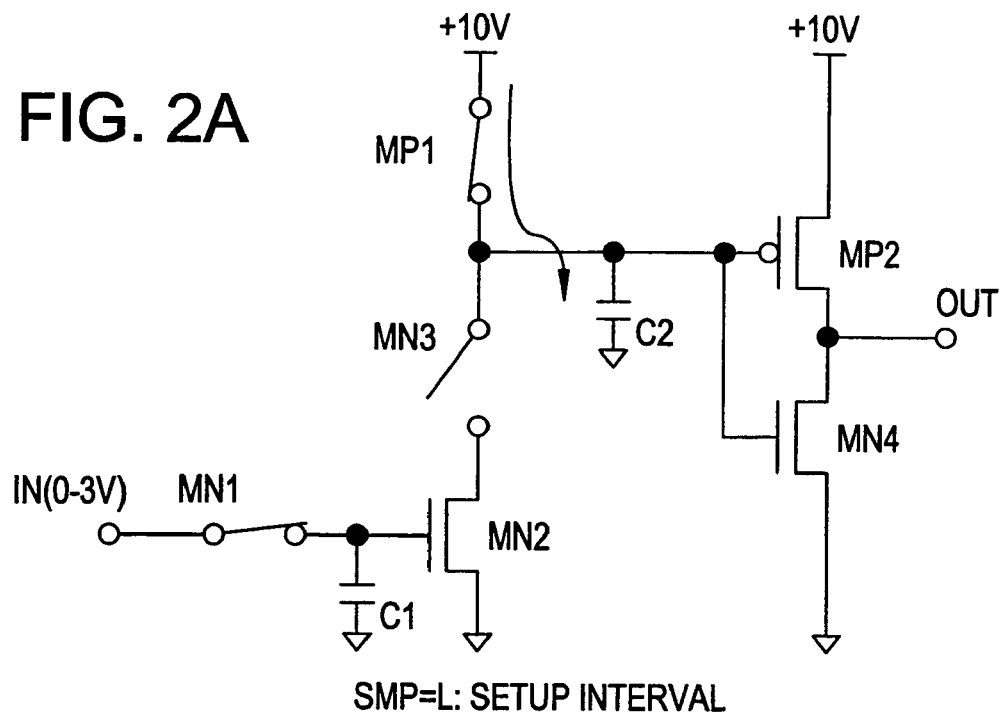
FIGS. 2A and 2B are diagrams useful in describing the operation of the sampling level converter circuit of the first embodiment.
Figure 2B:
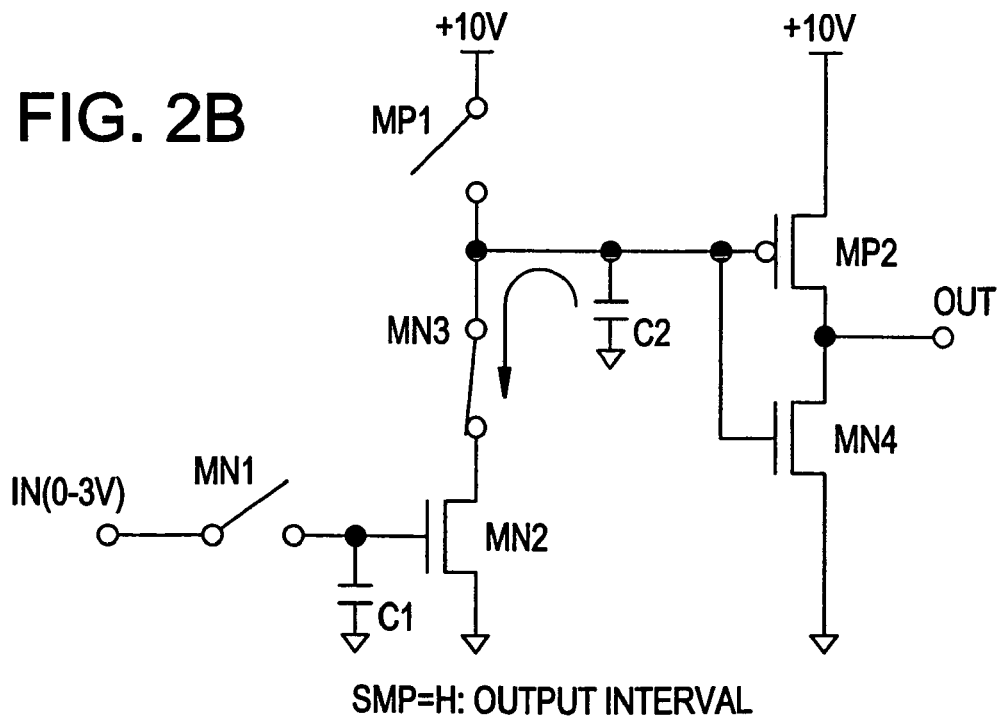

FIGS. 2A and 2B are schematic views useful in describing the operating principle of this embodiment.

In FIG. 2A, when the sampling pulse signal SMP is at the low level, the P-channel MOS transistor MP1 for pre-charging is turned on and the signal XSMP attains the high level (10 V). As a result, the N-channel MOS transistor MN1 is also turned on. The N-channel MOS transistor MN3, on the other hand, is turned off. As a consequence, the capacitor C2 is charged from the higher-potential power-supply (10 V) through the P-channel MOS transistor MP1 and is thus precharged to the power-supply voltage of 10 V. Further, the N-channel MOS transistor MN1 is turned on and hence, the potential of the input signal IN (0 to 3 V) is applied to the capacitor C1 as the terminal voltage thereof, whereby the capacitor C1 is charged. The interval(time-period) during which the sampling pulse signal SMP is at the low level shall be referred to as a "setup time-interval".

When the sampling pulse signal SMP attains the high level (the inverted signal XSMP is at the low level), the N-channel MOS transistor MN1 is turned off and the capacitor C1 is electrically cut off from the input terminal IN, as illustrated in FIG. 2B. Further, the N-channel MOS transistor MN3 for evaluation purposes is turned on, the P-channel MOS transistor MP1 for pre-charging is turned off and the capacitor C2 is connected to the lower-potential power-supply (ground) via the N-channel MOS transistors MN3 and MN2.

At this time the terminal voltage of capacitor C2 precharged to 10 V is maintained as is or discharged to 0 V in accordance with the input-signal potential (0 or 3 V) held in the capacitor C1. That is, if the terminal voltage of the capacitor C1 is 3 V, the N-channel MOS transistor MN2 whose gate receives the terminal voltage of the capacitor C1 is turned on, thereby discharging the electric charge that has been accumulated in the capacitor C2 so that the terminal voltage of the capacitor C2 falls to the low potential of the lower-potential power-supply (0 V, which is ground potential). The P-channel MOS transistor MP2, which receives a gate potential of 0 V, is turned on, the N-channel MOS transistor MN4 is turned off and the output terminal OUT attains the high level (10 V). It should be noted that as the capacitor C2 is in the process of discharging its accumulated electric charge, the terminal voltage thereof falls from 10 V by an amount equivalent to the threshold voltage of the P-channel MOS transistor MP2, at which time the P-channel MOS transistor MP2 is turned on and the output signal (OUT) starts to rise.

If the terminal voltage of capacitor C1 is 0 V, the N-channel MOS transistor MN2 is turned off, the electric charge that has been accumulated in the capacitor C2 is held and the terminal voltage of capacitor C2 is made 10 V. The P-channel MOS transistor MP2, which receives the gate potential of the 10 V, is turned off, the N-channel MOS transistor MN4 is turned on and therefore the signal voltage at the output terminal OUT becomes 0 V. As a result of the above operation, therefore, a signal of 10 V or 0 V is obtained from the output terminal OUT depending upon the input signal potential at the input terminal IN. The interval (time-period) during which the sampling pulse signal SMP is at the high level shall be referred to as the "output time-interval". It should be noted that as the capacitor C2 is in the process of being precharged, the terminal voltage thereof exceeds the threshold voltage of the N-channel MOS transistor NM4, at which time the N-channel MOS transistor MN4 is turned on and the output signal (OUT) falls.

The power consumption of the sampling level converter circuit shown in Fig., has been analyzed by a circuit simulation. The result shows that a value of 859 nW (nanoWatts) is obtained (where the frequency of the signal SMP is 62.5 KHz). Even if, e.g., 198 of this sampling level converter circuits are connected in parallel (see the sampling level shifter of FIG. 16), the value of power consumption is 172 µW (microwatts). Thus, a reduction in consumed power can be achieved.

A second embodiment of the present invention will now be described with reference to FIG. 3, which illustrates the structure of the second embodiment.

Figure 3:
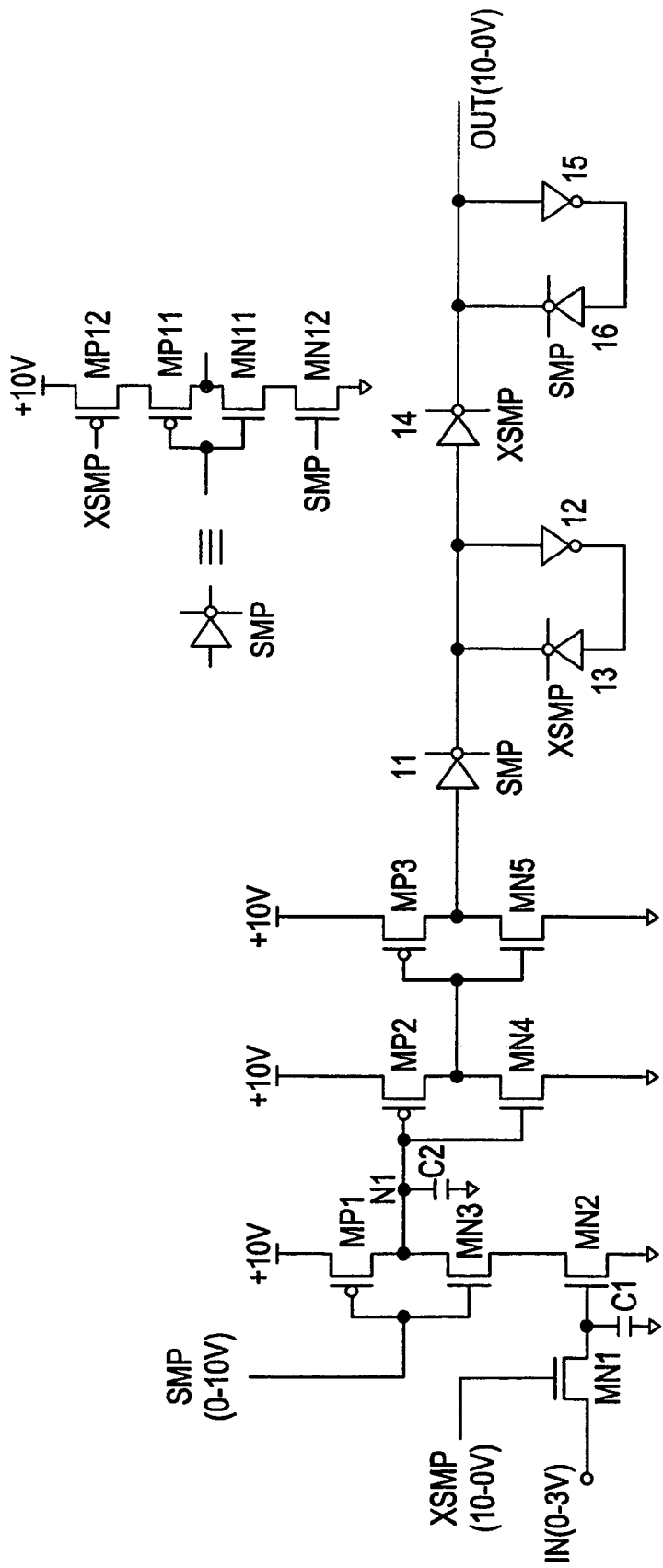
FIG. 3 is a diagram illustrating an arrangement having a sampling level converter circuit and a latch circuit according to a second embodiment of the present invention.

As shown in FIG. 3, this circuit is constructed by connecting an inverter and a latch circuit to the sampling level converter circuit depicted in FIG. 1, whereby there is obtained an output signal synchronized to the sampling pulse signal SMP.

As described in conjunction with the foregoing embodiment, the sampling level converter circuit is such that two types of operation mode time interval are repeated in alternating fashion, the two types of time interval being the setup time-interval, in which the capacitor C2 is precharged to 10 V and the capacitor C1 is charged by the input signal voltage when the sampling pulse signal SMP is at the low level, and the output time-interval, in which a signal conforming to the input signal voltage is output when the sampling pulse signal SMP is at the high level.

This sampling level converter circuit is provided with a first CMOS inverter, which comprises the P-channel MOS transistor MP2 and N-channel MOS transistor MN4 having their gates tied together and their drains tied together and being connected serially between the high- and lower-potential power-supplys, and a second CMOS inverter, which comprises a P-channel MOS transistor MP3 and an N-channel MOS transistor MN5 having their gates tied together and their drains tied together and being connected serially between the high- and lower-potential power-supplys. The output terminal of the first CMOS inverter is connected to the input terminal of the second CMOS inverter, and the output terminal of the second CMOS inverter is connected to the input terminal of a master/slave latch, in which data is sampled at the rising edge of the sampling pulse signal SMP, and from which the data is output at the falling edge of the sampling pulse signal SMP.

The latch comprises a master latch unit and a slave latch unit. The master latch unit includes a clocked inverter 11, an inverter 12, and a clocked inverter 13. The clocked inverter 11 is turned on (activated) in response to the high level of the sampling pulse signal SMP applied to its control terminal and is turned off in response to the low level of this signal. The inverter 12 has an input terminal connected to the output terminal of the clocked inverter 11. The clocked inverter 13 is turned on in response to the high level of the signal XSMP, which is the inverted signal of the sampling pulse signal SMP applied to the control terminal of this inverter, and is turned off in response to the low level of the signal XSMP. The connection between the clocked inverters 11 and 13 is connected to the input terminal of the inverter 12. The slave latch unit includes a clocked inverter 14, an inverter 15, and a clocked inverter 16. The clocked inverter 14 which has an input terminal connected to the output terminal of the clocked inverter 11, is turned on in response to the high level of the signal XSMP applied to its control terminal and is turned off in response to the low level of this signal, The inverter 15 has an input terminal connected to the output terminal of the clocked inverter 14. The clocked inverter 16 is turned on in response to the high level of the signal SMP applied to its control terminal, and is turned off in response to the low level of the signal SMP. The connection between the clocked inverters 14 and 16 is connected to the input terminal of the inverter 15.

As shown in FIG. 3, the clocked inverters include P-channel MOS transistor MP12 and MP11 and N-channel MOS transistors MN11 and MN12 connected between the higher-potential power-supply (10 V) and lower-potential power-supply (ground). The signal SMP is supplied to the gate of the N-channel MOS transistor MN12 and the signal XSMP is supplied to the gate of the P-channel MOS transistor MP12. When the MOS transistors MN12 and MP12 are rendered conductive (turned on), the MOS transistors MP11 and MN11 function as a CMOS inverter. When the MOS transistors MN12 and MP12 are rendered non-conductive (turned off), the output terminal is in a high impedance state. It should be noted that in the drawings attached to this specification, the signal name (e.g., SMP or XSMP) shown below each clocked inverter indicates that the clocked inverter is turned on by the high level of the signal name and turned off by the low level thereof.

Referring to FIG. 3, the clocked inverter 11 is rendered conductive at the rising edge of the sampling pulse signal SMP, the output signal of the second CMOS inverter (MOS transistors MP3, MN5) is stored in the master latch unit, the clocked inverter 11 is turned off at the falling edge of the sampling pulse signal SMP and the clocked inverter 13 is turned on, thereby forming a flip-flop together with the inverter 12. The master latch unit stores the data and the clocked inverter 14 is turned on, whereby the data out delivered from the output terminal OUT.

When the clocked inverter 11 is rendered conductive at the rising edge of the sampling pulse signal SMP of the next cycle, the clocked inverter 14 is turned off and the slave latch unit stores the data output to the output terminal OUT.

Figure 4:
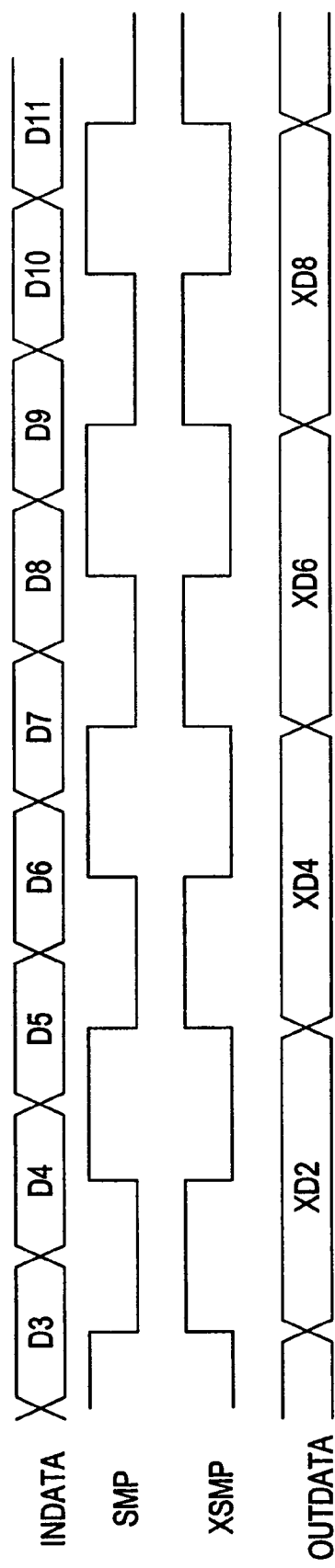
FIG. 4 is a diagram useful in describing the operation of the sampling level converter circuit and an inverter according to the second embodiment.

FIG. 4 is a timing chart illustrating an example of operation of the circuit depicted in FIG. 3. The operation of this circuit will be described with reference to FIG. 4.

The period of time over which the sampling pulse signal SMP is at the low level is the setup time-interval. The high voltage (10 V) or low voltage (ground potential) corresponding to the input data (INDATA) is output from the second CMOS inverter of the sampling level converter circuit at the rising edge of the sampling pulse signal SMP. This voltage is latched in the master/slave latch and is output at the falling edge of the sampling pulse signal SMP.

In the example shown in FIG. 4, OUTDATA that is output in sync with the falling edge of the sampling pulse signal SMP (the rising edge of signal XSMP) is made data having a data number for which the timing of the rising edge of the sampling pulse signal SMP is located within in the data cycle of the input data INDATA applied to the input terminal IN of the sampling level converter circuit. These items of data are even-numbered, i.e., D4, D6, D8, . . . , D2n.

When the signal voltage of the input terminal IN is at the high level, a node N1 (the terminal voltage of the capacitor C2) in the sampling level converter circuit falls to the ground level in the output time-interval in which the sampling pulse signal SMP is at the high level. The two stage CMOS inverters (a non-inverting buffer), which receives the ground potential, outputs the ground potential (the low level). The high level (10 V) is output via the clocked inverter 11, which receives the low-level signal, and the low level is output from the output terminal OUT via the clocked inverter 14 at the timing of the high level of signal XSMP.

When the signal voltage at the input terminal IN is at the low level, the node N1 rises to 10V in the output time-interval in which the sampling pulse signal SMP is at the high level. The two stage CMOS inverters, which receives the voltage of the node N1, outputs the high level (10 V). The high level is output to the output terminal OUT via the clocked inverter 14 at the timing of the high level of signal XSMP. The output signal of 0 to 10 V is the inverted logic of the input data.

In response to the high level of the sampling pulse signal SMP, the sampling level converter circuit is in the output time-interval, an output signal is delivered to the output terminal OUT at the falling edge of the sampling pulse signal SMP, i.e., the rising edge of the signal XSMP, and the output timing of the output signal lags by one-half cycle of the sampling pulse signal SMP.

Figure 5:
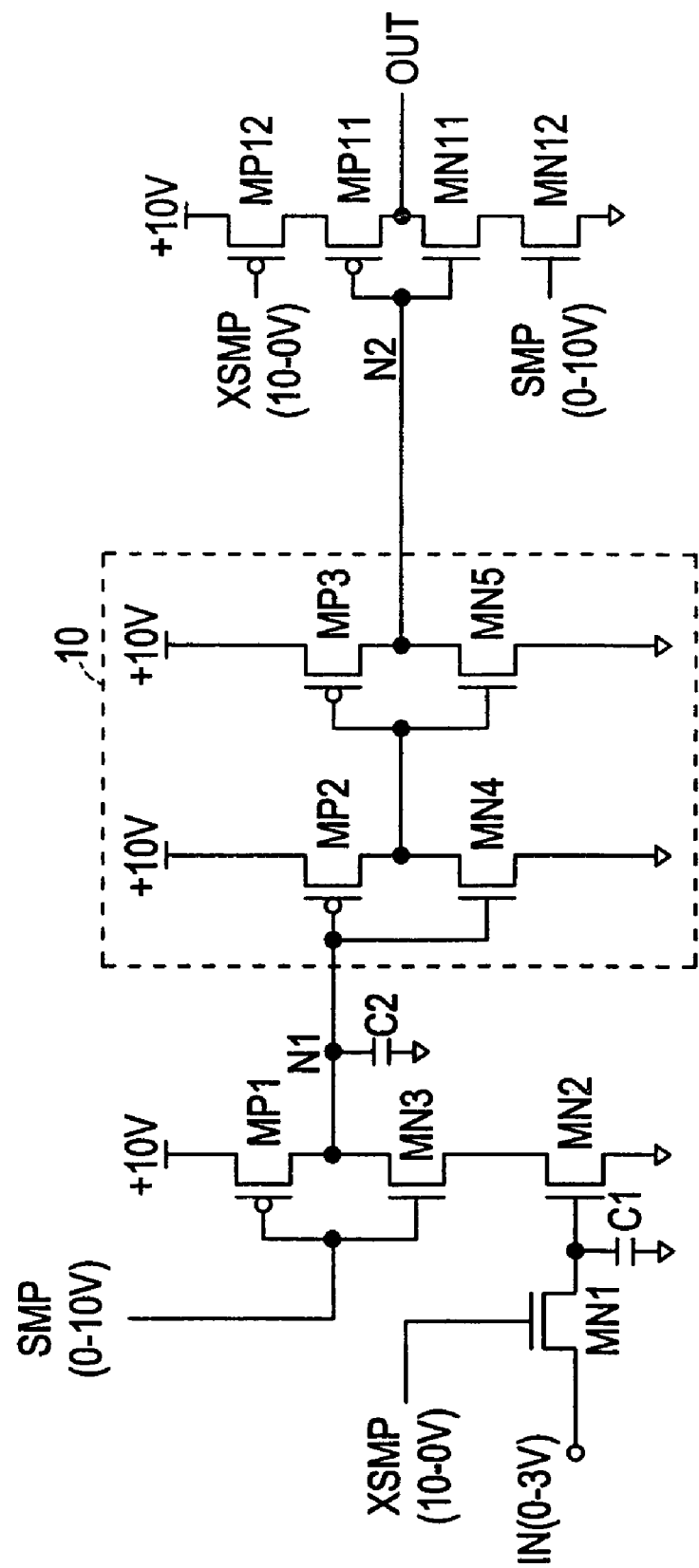
FIG. 5 is a diagram illustrating an arrangement having a sampling level converter circuit and an inverter circuit according to the second embodiment.

In a case where an even number of CMOS inverters (CMOS inverter circuit 10 in FIG. 5) or no CMOS inverters are connected to the node N1 of the sampling level converter circuit shown in FIG. 1 and a clocked inverter that is activated (turned on) by the sampling pulse signal SMP is connected as the final stage, this circuit will not malfunction owing to the existence of clock skew involving the sampling pulse signal SMP and the signal XSMP obtained by inverting the signal SMP. In FIG. 5, the clocked inverter includes P-channel MOS transistor MP12 and MP11, and N-channel MOS transistors MN11 and MN12 connected between the higher-potential power-supply (10 V) and lower-potential power-supply (ground). The signal SMP is supplied to the gate of the N-channel MOS transistor MN12, the signal XSMP is supplied to the gate of the P-channel MOS transistor MP12, and the output of the CMOS inverter circuit 10, which is obtained by connecting an even number of CMOS inverters or no CMOS inverters, is supplied to the common gate (node N2) of the P-channel MOS transistor MP11 and N-channel MOS transistor MN11. This clocked inverter corresponds to the clocked inverter 11 shown in FIG. 3.

Figure 6A:
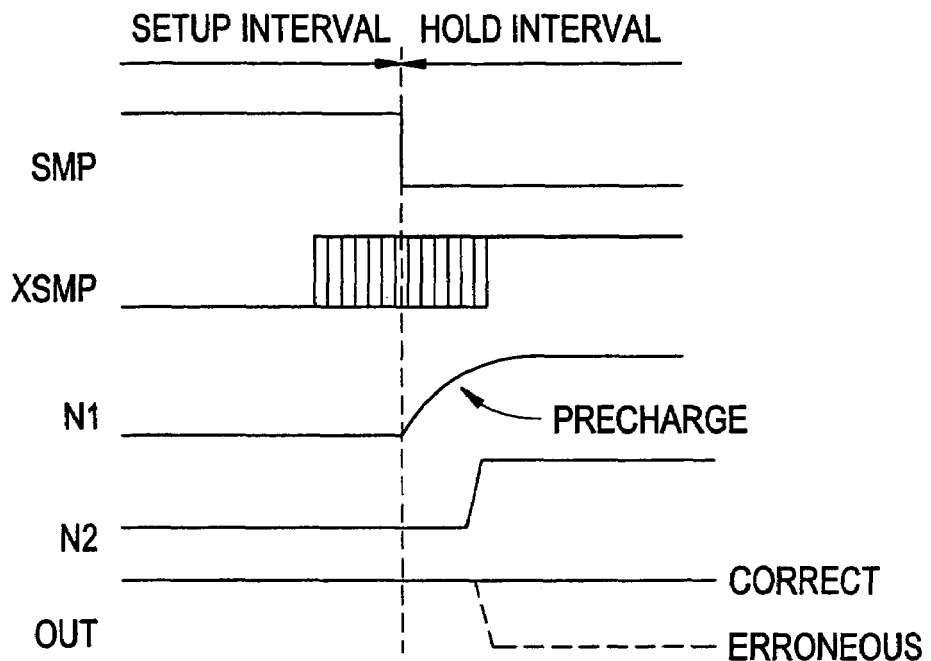
FIGS. 6A and 6B are diagrams useful in describing absence and presence of occurrence of a malfunction owing to clock skew in the arrangement having the sampling level converter circuit and inverter circuit according to the second embodiment.
Figure 6B:
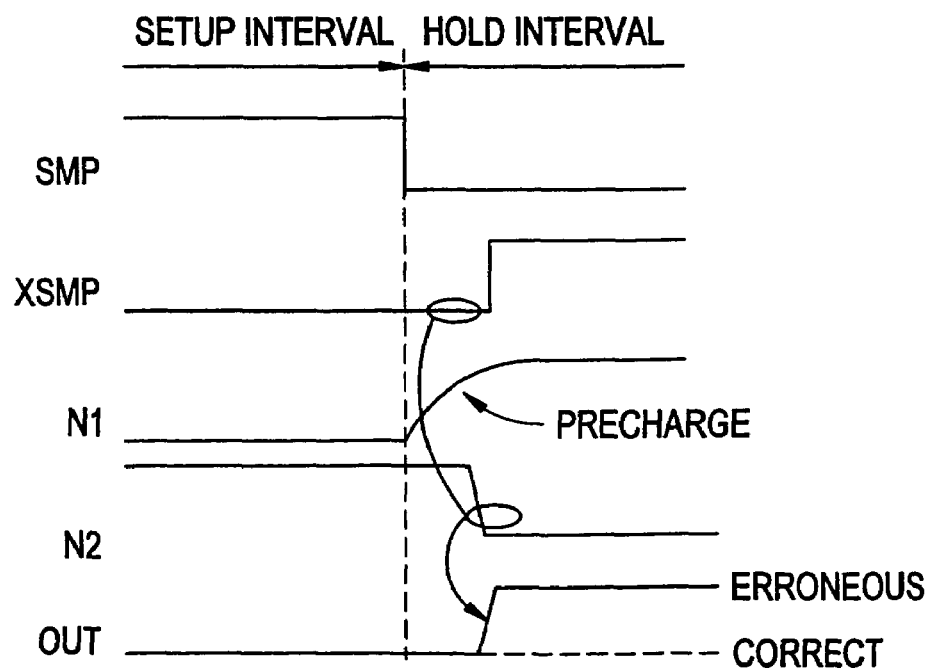

The principle according to which the circuit shown in FIG. 5 is not allowed to malfunction owing to clock skew will be described with reference to FIGS. 6A and 6B. As shown in FIG. 6A, the sampling pulse signal SMP initially is at the high level and the signal XSMP that is the inverted signal of the sampling pulse signal is at the low level. At this time, both the node N1 and the node N2 in FIG. 5 are at 0 V, the P-channel MOS transistor MP2 of the clocked inverter is on and the output terminal OUT is at the high potential (10 V).

Starting from these conditions, the P-channel MOS transistor MP1 is turned on at the same time that the sampling pulse signal SMP falls, pre-charging of the capacitor C2 from the higher-potential power-supply (10 V) starts, the potential at node N1 rises and the potential at node N2 (the potential at node N1 per se if the CMOS inverter circuit 10 has zero inverter stages) rises following a delay equivalent to the propagation delay time of the even-numbered or zero-stage CMOS inverter circuit 10, whereby a transition to the high level (10 V) is made. The N-channel MOS transistor MN12 of the clocked inverter is turned off (that is, in a high impedance state) at the same time that the sampling pulse signal SMP falls. Thereafter, even though the node N2 is at the high potential (10 V), the N-channel MOS transistor MN11 does not turn on and the output at the output terminal OUT does not fall to the low level (0 V). Thus, the circuit operation is not affected by variation (skew) with regard to the timing of the rising edge of the signal XSMP and the output signal from the output terminal OUT will not fall to the low level. In other words, malfunction is avoided even under the presence of clock skew. It will be understood, therefore, that system operation is free of clock skew.

If the CMOS inverter circuit 10 of FIG. 5 is composed by cascade-connecting an odd number of inverter stages, on the other hand, the node N2 assumes a potential that is the inverse of the potential at the node N1. Assume that initially the sampling pulse signal SMP is at the high level (10 V), the signal XSMP is at the low level, the node N1 is at 0 V and the node N2 is at 10 V. At this time the P-channel MOS transistor MP12 is on, the N-channel MOS transistor MN11 is off, the N-channel MOS transistors MN11 and MN12 are both on and the output signal from the output terminal OUT is at the low level (0 V).

Starting from these conditions, the P-channel MOS transistor MP1 is turned on at the same time that the sampling pulse signal SMP falls, pre-charging of the capacitor C2 from the higher-potential power-supply (10 V) starts, the potential at the node N1 rises and the potential at the node N2 falls following a delay equivalent to the propagation delay time of the CMOS inverter circuit 10 comprised of an odd number of inverter stages, whereby a transition to the low level (0 V) is made. The N-channel MOS transistor MN12 of the clocked inverter is turned off (in a high impedance status) at the same time that the sampling pulse signal SMP falls. When the node N2 then falls to the low level, the signal XSMP is still at the low level, the P-channel MOS transistors MP12 and MP11 are turned on and the output signal at the output terminal OUT attains the high level (10 V). Thus, in a case where the CMOS inverter circuit 10 of FIG. 5 is constructed by connecting an odd number of inverter stages, malfunction occurs owing to delay of the rising edge of signal XSMP obtained by inverting the sampling pulse signal SMP. In other words, in a case where the inverted signal XSMP is generated by inverting the sampling pulse signal SMP using inverters and a delay due to the propagation delay time of the inverters is not adjusted, a malfunction is caused by the delay of the rising edge of signal XSMP.

A third embodiment of the present invention will now be described with reference to FIG. 7, which is a diagram illustrating the structure of this embodiment. This diagram shows the structure of a circuit for expanding serial data to 2-phase data.

Two circuits, each of which is made up of a sampling level converter circuit, a plurality of inverters and a master/slave latch and has been described with reference to FIG. 3, are connected in parallel with respect to a single data input terminal DATA and a latch unit of a single stage is added onto one of these two circuit, whereby even-numbered input data and odd-numbered input data are output in parallel, in sync with the rising edge of the sampling pulse signal SMP, at a frequency obtained by dividing the frequency of the input data by 2. More specifically, as shown in FIG. 7, two sampling level converter circuits of the above-described embodiment are provided in parallel with respect to the data input terminal DATA. As shown in FIG. 7, the first sampling level converter circuit has two stages of CMOS inverters arranged in an output stage and is provided with a master latch and a slave match, a latch of a single stage and inverters, with DATAODD/XDATAODD being output from the inverters. The second sampling level converter circuit has two CMOS inverters arranged in an output stage and is provided with a master latch and a stave match and inverters, with DATAEVEN/XDATAEVEN being output from the inverters.

More specifically, the circuit that outputs the odd-numbered signal includes the first sampling level converter circuit (MOS transistors MN1, MN2, MN3, and MP1, and capacitors C1 and C2), the structure of which is the same as that described above with reference to FIG. 3; two cascade-connected CMOS inverters (MOS transistors MP2 and MN4, and MOS transistors MP3 and MN5); a master-slave latch (which comprises the clocked inverter 11, inverter 12, clocked inverters 13 and 14, inverter 15 and clocked inverter 16, the structure of this master/slave latch being identical with that of the master/slave latch of FIG. 3) that includes a master latch in which data is stored when the sampling pulse signal SMP attains the high level and a slave latch for outputting data when the inverted signal XSMP attains the high level and storing output data when the next sampling pulse signal SMP attains the high level; a latch (comprising a clocked inverter 17, an inverter 18 and a clocked inverter 19) for outputting data at the high level of the sampling pulse signal SMP and storing output data when the signal XSMP is at the high level; an inverter 20 for inverting and outputting the output of the clocked inverter 17; and an inverter 21 for inverting and outputting the output of the inverter 18. The output terminals of the inverters 21 and 20 deliver an odd-numbered signal DATAODD and its complement (inverted) signal XDATAODD, respectively.

In the first sampling level converter circuit arranged in the path for outputting the odd-numbered signal DATAODD, the signal XSMP obtained by inverting the sampling pulse signal SMP is supplied to the gate of the N-channel MOS transistor MN1, the sampling pulse signal SMP is supplied to the gates of both MOS transistors MP1 and MN3, the low level of the sampling pulse signal SMP is adopted as a precharge period and the high level as the output time-interval, and the data from the first sampling level converter circuit is output as data (DATAODD) at the rising edge of the next sampling pulse signal SMP, in a manner similar to that of FIG. 3. The sampling pulse signal SMP has a clock rate that is half the data rate. That is, the first sampling level converter circuit and the latch unit accept data at the rising edge of the sampling pulse signal SMP and output data in sync with the rising edge of the sampling pulse signal SMP of the next cycle.

The circuit that outputs the even-numbered signal (DATAEVEN) includes the second sampling level converter circuit (MOS transistors MN6, MN7, MN8, and MP4, and capacitors C1 and C2); two cascade-connected CMOS inverters (MOS transistors MP5 and MN9, and MOS transistors MP6 and MN10); a master-slave latch (which comprises a clocked inverter 22, an inverter 23, clocked inverters 24 and 25, an inverter 26 and a clocked inverter 27) that includes a master latch in which data is loaded when the signal XSMP attains the high level and a slave latch for outputting data when signal SMP attains the high level and storing the output value when the next signal XSMP attains the high level; an inverter 28 for inverting and outputting the output of the clocked inverter 25; and an inverter 29 for inverting and outputting the output of the inverter 26. The output terminals of the inverters 28 and 29 deliver an even-numbered signal DATAEVEN and its inverted signal XDATAEVEN, respectively.

In the second sampling level converter circuit arranged in the path for outputting the even-numbered signal DATAEVEN, the sampling pulse signal SMP is supplied to the gate of the N-channel MOS transistor MN6 that constitutes the sampling circuit, the inverted signal XSMP is supplied to the gates of both MOS transistors MP4 and MN8, the low level of the inverted signal XSMP is adopted as a precharge interval and the high level as the output time-interval, and the data in the master/slave latch is output at the rising edge of the sampling pulse signal SMP. That is, the second sampling level converter circuit and the latch unit in the path that outputs the even-numbered signal accept data at the falling edge of the sampling pulse signal SMP (the rising edge of the signal XSMP) and output data at the rising edge of the sampling pulse signal SMP (the falling edge of the signal XSMP) of the next cycle. In the path that outputs the odd-numbered signal DATAODD, the master/slave latch is further provided with a latch (components 17, 18, and 19), which outputs data one-half cycle of the sampling pulse signal SMP later than the latch (master/slave latch) in the path that outputs the even-numbered signal DATAEVEN.

Figure 8:
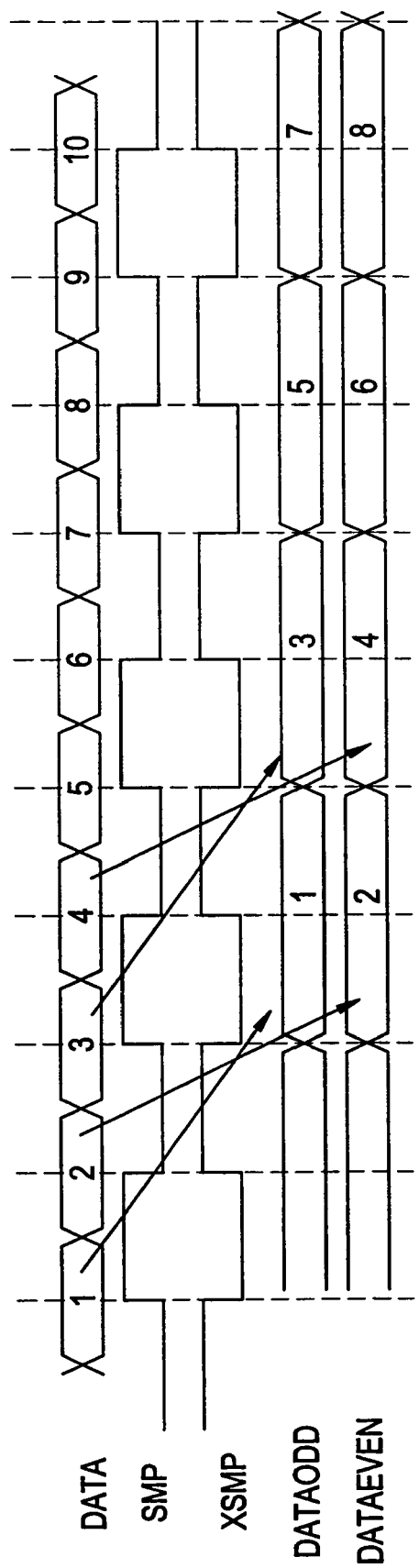
FIG. 8 is a diagram useful in describing the operation of the 2-phase expanding circuit according to the third embodiment.

As a result, as shown in FIG. 8, DATA 1, 3, 5, 7, . . . is output as the odd-numbered signal DATAODD and data 2, 4, 6, 8, . . . as the even-numbered signal DATAEVEN sequentially in sets of (DATA 1, 2), (DATA 3, 4), (DATA 5, 6), . . . , with respect to entered serial data DATA 1, 2, 3, 4, 5, 6, 7, . . . , in sync with the rising edge of the sampling pulse signal SMP. One cycle of DATAODD and DATAEVEN corresponds to two cycles of the input data DATA.

Figure 24A:
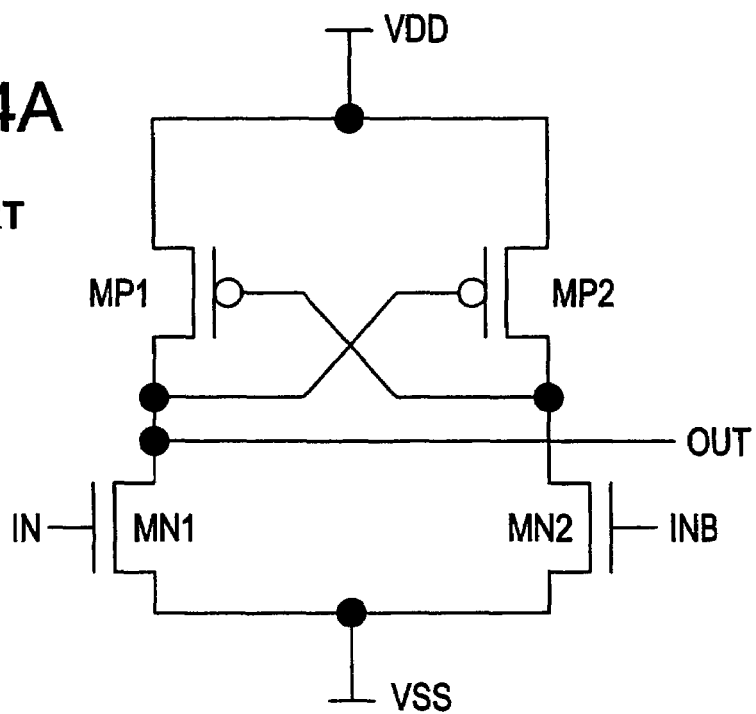
FIGS. 24A and 24B are diagrams illustrating structures of level converter circuits according to the prior art.
Figure 24B:
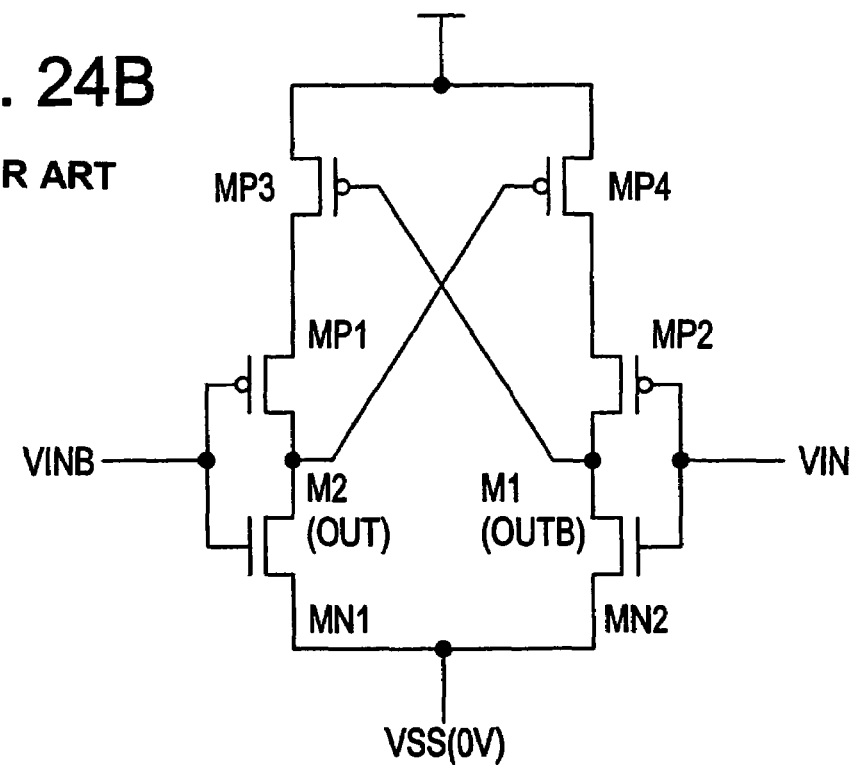
Figure 25A:
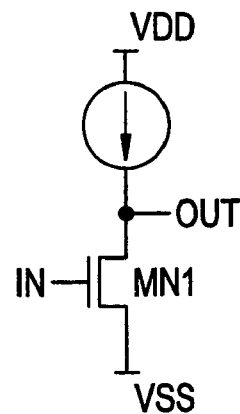
FIGS. 25A, 25B and 25C are diagrams illustrating structures of level converter circuits according to the prior art.
Figure 25B:
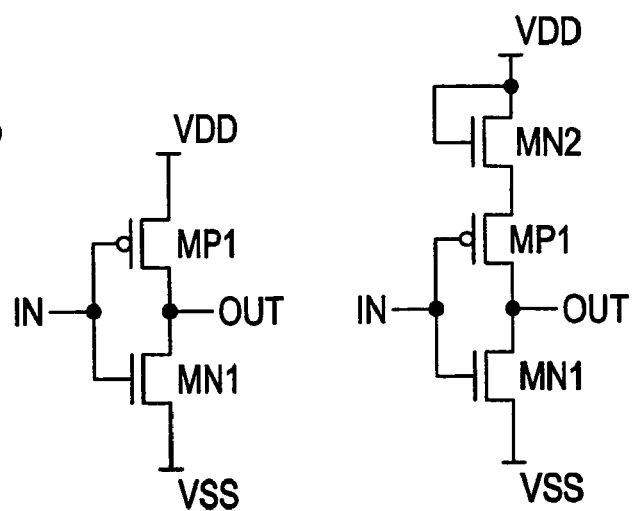
Figure 25C:
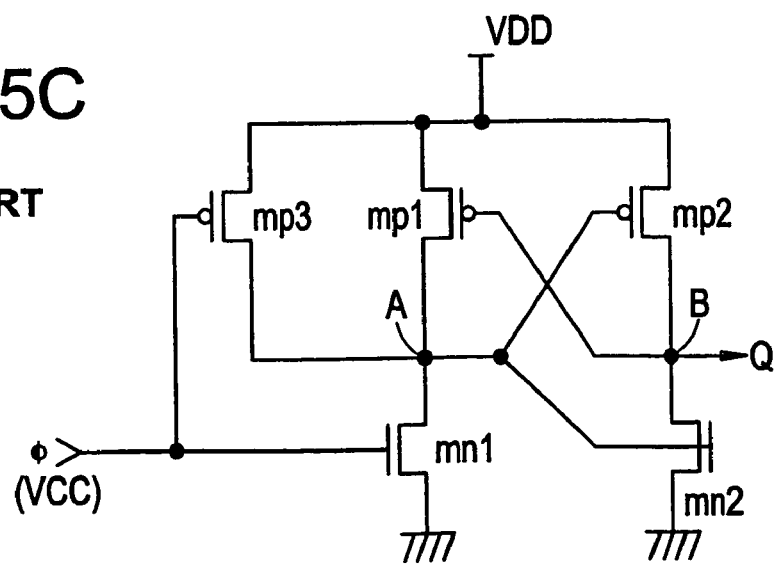
Figure 26:
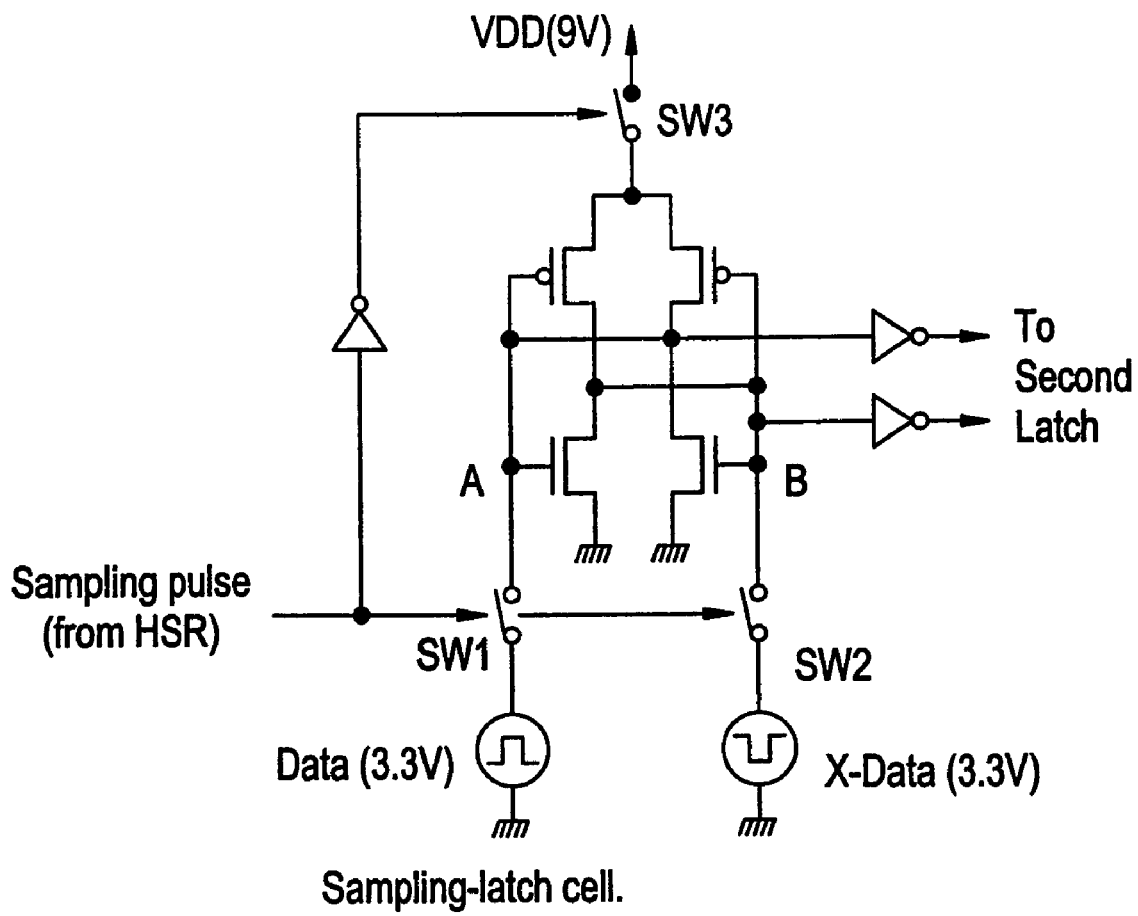
FIG. 26 is a diagram illustrating the structure of a level converter circuit according to the prior art.

By thus expanding input data to two phases by the 2-phase expanding circuit, the operating frequency of succeeding circuitry is reduced by half. Though the sampling pulse signal SMP and its inverted signal XSMP require an amplitude of 0 to 10 V, in a liquid crystal display module, these signals are used in common with respect to, e.g., 198 sampling level converter circuits. As a result, a level converter circuit for creating the sampling pulse signal SMP and its inverted signal XSMP may employ the conventional level converter circuit described above with reference to FIG. 24.

In a case where the 2-phase expanding circuit shown in FIG. 7 is applied to an arrangement in which the signal of an external signal processing circuit is level-shifted to achieve a 2-phase expansion, the interface for a controller IC 120 is made one having a bit width of 198 bits and a frequency of 125 KHz (8 $\mu$s), the signal is subjected to a 2-phase expansion within the panel 100, and a 396-bit, 62.5-KHz signal is delivered to a 6-bit DAC 104 composed of 66 circuits.

A specific example of design of a sampling level converter circuit in a case where a polysilicon TFT on an insulating substrate is used as a transistor element will now be described as a specific example of a sampling level converter circuit according to this embodiment with reference to FIG. 9.

Figure 9:
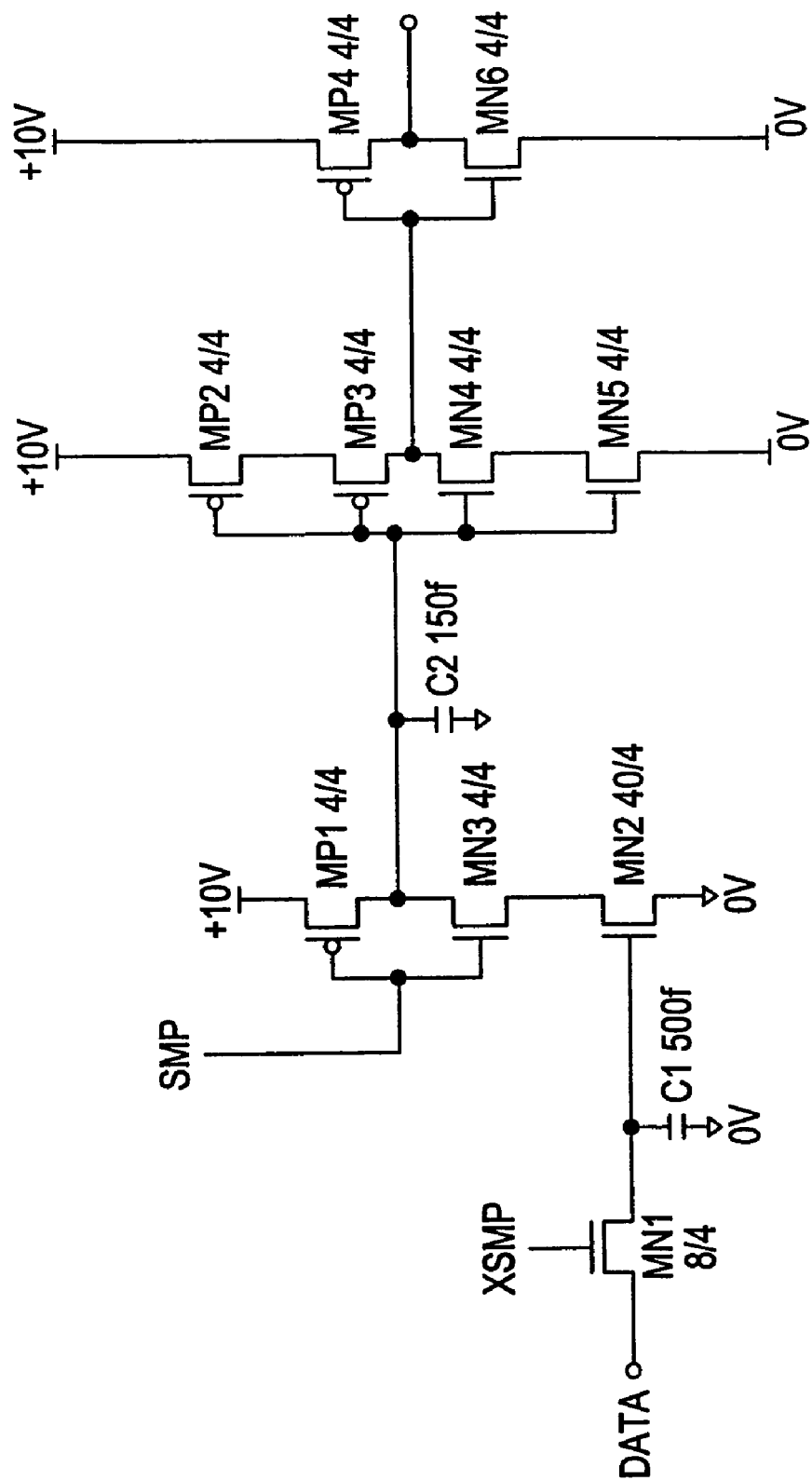
FIG. 9 is a diagram useful in describing design of a sampling level converter circuit according to an embodiment of the present invention.

As shown in FIG. 9, a two-stage CMOS inverters (MOS transistors MP2, MP3, MN4, and MN5, and MOS transistors MP4 and MN6) is connected to the sampling level converter circuit (MOS transistors MN1, MN2, MN3 and MP1 and capacitors C1 and C2) constructed as depicted in FIG. 1. When the sampling pulse signal SMP is at the low level, the capacitor C2 in the sampling level converter circuit is precharged and the capacitor C1 is charged by the input voltage. The CMOS inverter of the first stage, made up of four MOS transistors (MP2, MP3, MN4, and MN5) connected in series between the high-potential power supply and the low potential power supply, reduces short-circuit current (from the high-potential power supply to the low potential power supply) of the inverter. That is, the time required to discharge the electric charge that has been accumulated in the precharged capacitor C2 is long in comparison with an ordinary logic signal, and transient time is lengthened. For this reason, the inverter of the first stage to which the terminal voltage of capacitor C2 is supplied is designed to reduce the short-circuit current. Further, owing to charge redistribution, which is described later, there are cases where the terminal voltage (high level) of the capacitor C2 falls from 10 V and becomes 9.5 V. The short-circuit current at such time is reduced. It should be noted that the inverter of the first stage comprising four transistors (MP2, MP3, MN4, and MN5) connected in series may be replaced by a CMOS inverter composed of 2 transistors, i.e., NMOS and PMOS transistors, the gate length L of which is doubled respectively, and which are connected in series between the high-potential power supply and the low potential power supply.

In a case where the discharge time of the capacitor C2 is such that the capacitor can be discharged in a prescribed period of time (e.g., 8 $\mu$s, which is one cycle of a 125-KHz signal) via the path of N-channel MOS transistors MN3 and MN2 and lower-potential power-supply (0 V), the characteristic of the N-channel MOS transistor MN2, which has a gate-to-source voltage VGS of 3 V, becomes predominant. The gate-to-source voltage VGS is set to 3 V by the terminal voltage of capacitor C1 when the voltage of the input data is 3 V.

With regard to the charge holding characteristic of the capacitor C2, it is required that the terminal voltage of the capacitor C2 be held for a prescribed period of time (e.g., 8 $\mu$s) when the sampling pulse signal SMP is at the high level (10 V) and the gate voltage of the N-channel MOS transistor MN2 is 0 V.

If the N-channel MOS transistor MN3 is turned on when the gate voltage of the N-channel MOS transistor MN2 (referred to as a "detecting transistor") is 0 V and the sampling pulse signal SMP is at the high level, the electric charge that has accumulated in the capacitor C2 is redistributed by a combined capacitance Cs, which is the total capacitance of the N-channel MOS transistor MN3 whose drain is connected to the node of capacitor C2 and which is in an ON state, and of the N-channel MOS transistor MN2, in addition to the stray capacitance applied to the node of capacitor C2, i.e., the parasitic capacitance of the P-channel MOS transistor MP1 whose drain is connected to the node of capacitor C2.

In this case, stray capacitance Cn of MOS transistors other than the P-channel MOS transistor MP1 connected to the capacitor C2 is decided by gate-to-drain capacitance Cgd (MN3), which is the gate-to-channel capacitance, gate-to-source capacitance Cgs (MN3) and gate-to-bulk capacitance Cgb (MN3) of the N-channel MOS transistor MN3, and gate-to-drain capacitance Cgd (MN2) of the N-channel MOS transistor MN2 (to the gate of which 0V is being applied). Gate-to-bulk capacitance Cgb (MN2) need not be taken into account because transistor MN2 is off. Further, gate-to-drain capacitance Cgd (MN2) is regarded as substantially zero. Ultimately, the parasitic capacitance Cn is approximated by a value obtained by multiplying electrostatic capacitance Cox (MN3) of a unit area of the oxide film of the gate of N-channel MOS transistor MN3 by area A (=W·L, where W represents the gate width and L the gate length) of this gate electrode. It is well known that gate-to-bulk capacitance Cgb in a polysilicon MOS transistor is constant at the time of cut-off when the gate-to-source voltage is less than the threshold voltage. In the case of an N-channel TFT element having an SOI (Silicon On Insulator) structure, there is no bulk and the gate-to-bulk capacitance Cgb at cut-off is frequency-dependent and not fixed.

Owing to redistribution of electric charge due to stray capacitance Cs which is added to the terminal of capacitor C2, the terminal voltage of capacitor C2 falls below the power-supply voltage of 10 V to which the capacitor was precharged in the setup time-interval. That is, when the input signal voltage is 0 V, the terminal voltage of the capacitor C1 is made 0 V in the setup time-interval and the N-channel MOS transistor MN2, to the gate of which 0 V is applied, is turned off to close the discharging path of capacitor C2 in the output time-interval, in which the sampling pulse signal SMP attains the high level. As a consequence, even though the terminal voltage of capacitor C2 should be held at the power-supply voltage of 10 V, the actual terminal voltage of capacitor C2 falls below the precharged power-supply voltage of 10 V owing to redistribution of charge.

Let Cs represent the combined capacitance of the parasitic capacitances of MOS transistors MN3, MP1, and MN2 connected to the terminal of the capacitor C2, let V (=10 V) represent the initial (before charge redistribution) terminal voltage of capacitor C2, and let V' represent the terminal voltage of capacitor C2 after redistribution of charge. From $$C2 \cdot V = (Cs+C2)V'$$

we have $$V' = V \cdot C2/(Cs+C2) < V(=10 \text{ V}) \quad (1)$$

That is, when the input is 0 V (the terminal voltage of capacitor C1 is 0 V), the voltage drop _V after charge redistribution is given by $$*V = V - V' = V \cdot Cs/(Cs+C2) \quad (2)$$

When the voltage drop *V is large, leakage current increases and a logic inversion may occur in the worst case. In other words, when the terminal voltage of capacitor C2 is supposed to be at the high level (10 V), a situation can arise in which the terminal voltage takes the low level, which is less than a logic threshold value, owing to the voltage drop *V. If the capacitance of capacitor C2 is large for the same value of the combined capacitance Cs, *V decreases and the value of capacitor C2 is decided taking the above-mentioned charge redistribution into consideration.

In this embodiment, the ratio of gate width (W) to gate length (L) of the N-channel MOS transistor MN2 forming the detecting element is made 40/4 [in um(micro-meter) units], and the capacitance of the capacitor C2 is made 150 fF.

Further, upon taking into consideration the voltage drop of the capacitor C1 due to field-through and the charge/discharge time of capacitor C1, its capacitance is made 500 fF, a double-sided LDD (Lightly Doped Drain) structure is adopted for the N-channel MOS transistor MN1, and W/L thereof is made 8/4 (in um units).

Further, W/L of the N-channel MOS transistor MN3 and P-channel MOS transistor MP1 is made 4/4 (in um units).

Figure 10:
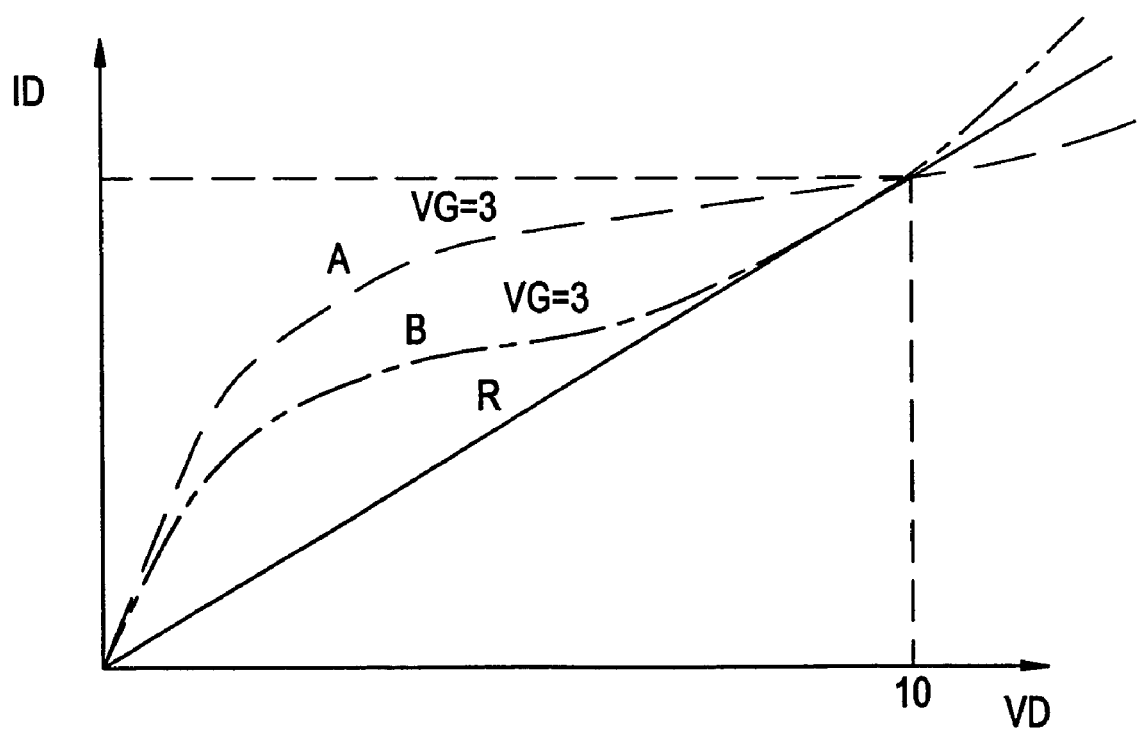
FIG. 10 is a diagram useful in describing design of a sampling level converter circuit according to an embodiment of the present invention, this being a graph illustrating the characteristic of a detection transistor.

The specifications of the N-channel MOS transistor MN2 will be described with reference to the characteristic diagram of FIG. 10, which illustrates the characteristic of drain voltage VD versus drain current ID of the N-channel MOS transistor MN2 when the gate voltage VG thereof is 3 V. At a drain voltage VD of 10 V and a gate voltage VG of 3 V, behavior at a drain-to-source voltage VDS of less than 10 V differs, as indicated by the characteristic curves A and B, owing to a variation in threshold voltage VTH, transconductance and channel conductance, even for transistors having the same drain current ID. Consequently, the time required discharging the capacitor C2 also differs. In FIG. 10, discharge time of the capacitor C2 is such that R>B>A holds.

Figure 11:
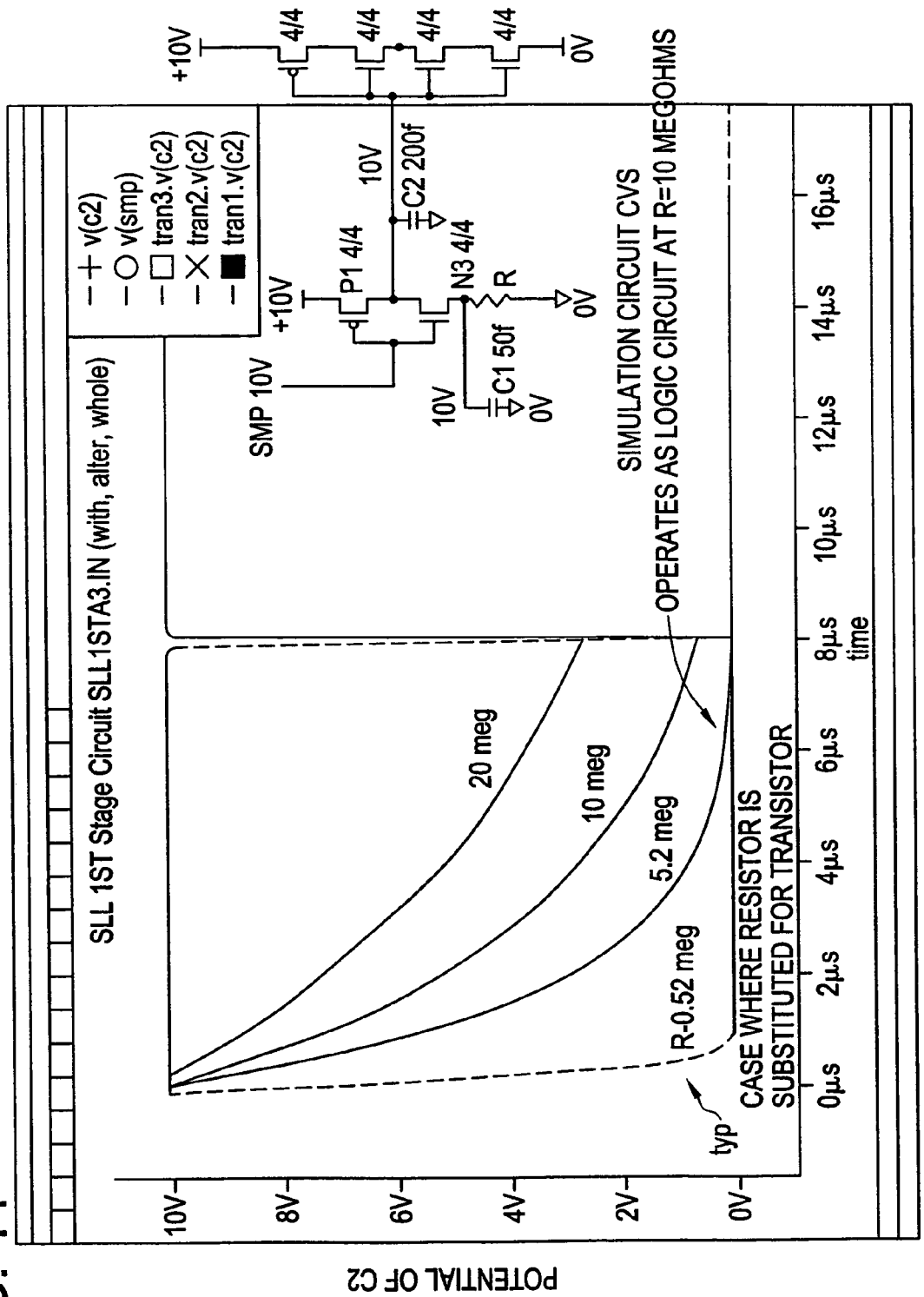
FIG. 11 is a diagram useful in describing design of a sampling level converter circuit according to an embodiment of the present invention, this being a graph illustrating the discharge characteristic of a pre-charging capacitor and the characteristic of a detection transistor.

In FIG. 10, R represents an equivalent resistance value for deciding the relationship between drain voltage VD and drain current ID (in accordance with Kirchoff's law). The relationship established is VD=R·ID. In a case where N-channel MOS transistor MN2 in the ON state is replaced by this resistor R (ON resistance), the discharge characteristic of the capacitor C2 becomes as shown in FIG. 11.

More specifically, if the N-channel MOS transistor MN2 is replaced by the ON resistance in FIG. 9, for example, R=10 megohms is made the upper limit in view of the discharge characteristic of the capacitor C2 in order for the circuit to operate as a logic circuit, i.e., in order to achieve a discharge time of 8 $\mu$s in conformity with the operating frequency of 125 KHz. In other words, discharge cannot be achieved within 8 us if the resistance R is greater than 10 Megohms.

Accordingly, on the assumption that R=10 Megohms holds, drain current ID>1 uA is adopted in a case where the N-channel MOS transistor MN2 has a W/L ratio of 40/4, a drain-to-source voltage VDS of 10 V and a gate voltage VG of 3 V, with the structure being a single-sided LDD.

Drain current ID>100 nA is adopted in a case where the N-channel MOS transistor MN2 has a W/L ratio of 4/4, a drain-to-source voltage VDS of 10 V and a gate voltage VG of 3 V, with the structure being a single-sided LDD.

In order to make the voltage drop due to leakage less than 0.5 V, drain current ID<940 nA is adopted in a case where the N-channel MOS transistor MN2 has a W/L ratio of 40/4, a voltage VDS of 10 V and a voltage VG of 0 V, with the structure being a single-sided LDD.

Further, ID<940 pA is adopted in a case where the N-channel MOS transistor MN2 has a W/L ratio of 4/4, a voltage VDS of 10 V and a voltage VG of 0 V, with the structure being a single-sided LDD.

Accordingly, the transistor specifications required for the N-channel MOS transistor MN2 in view of the discharge time of capacitor C2 (150 fF) is as follows:

ID>100 nA (single-sided LDD, W/L=4/4, VDS=10 V, VGS=3 V) and in view of the retention time of capacitor C2, ID<940 pA (single-sided LDD, W/L=4/4, VDS 0 V, VGS=3 V)

It should be noted that the threshold value VTH of the N-channel MOS transistor MN2 having the terminal voltage of the capacitor C1 input to its gate is made less than 3 V.

Figure 12:
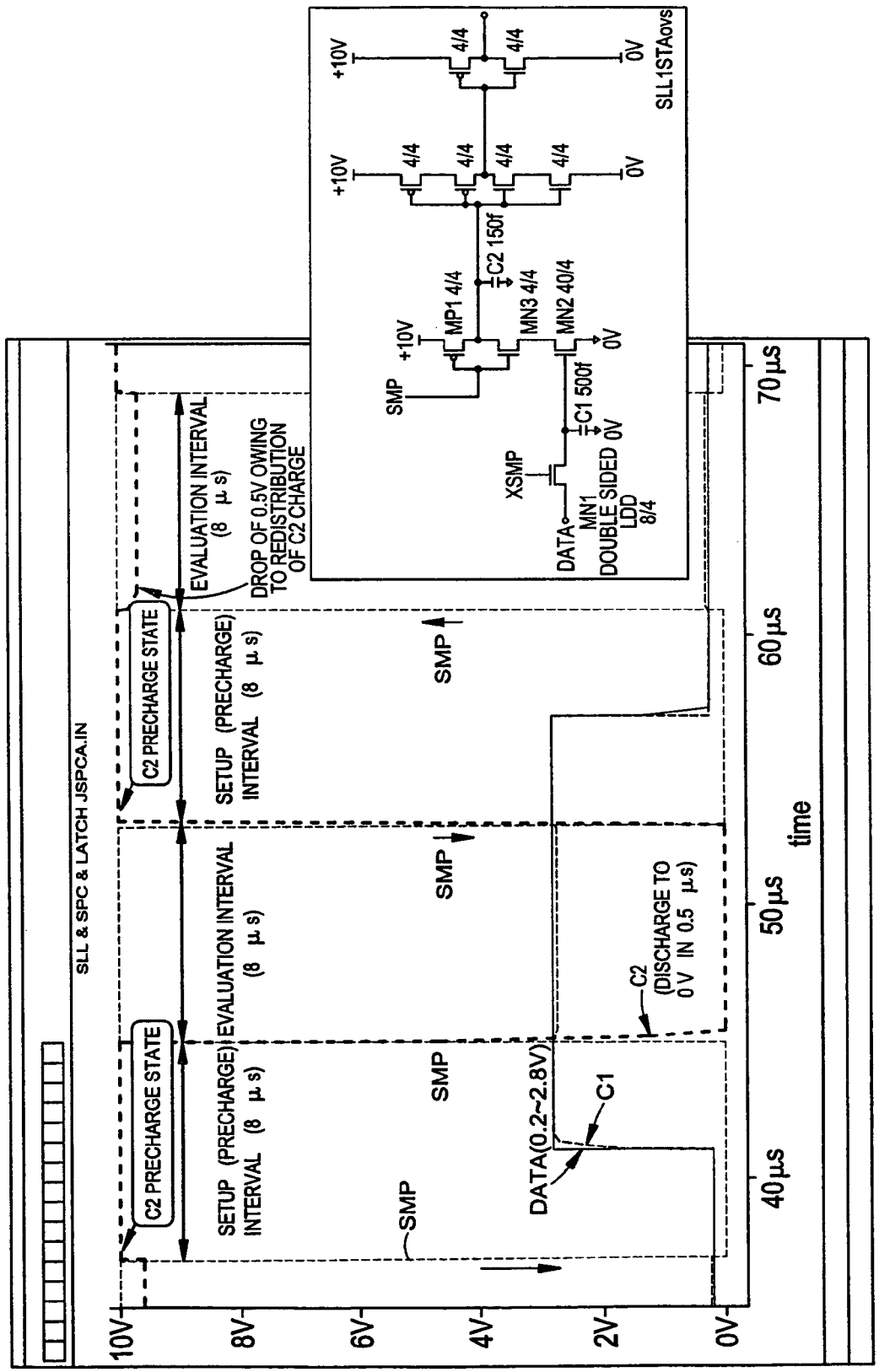
FIG. 12 is a diagram illustrating the result of simulating the operation of a sampling level converter circuit according to an embodiment of the present invention.

FIG. 12 is a diagram illustrating the result of a simulation using a TFT having a typical characteristic in the sampling level converter circuit shown in FIG. 9. Here it is assumed that the N-channel MOS transistor MN1 has a W/L ratio of 8/4 and a double-sided LDD structure, that the N-channel MOS transistor MN2 has a W/L ratio of 40/4, that the P-channel MOS transistors MP1, MP2, MP3, and MP4, and N-channel MOS transistors MN3, MN4, MN5, and MN6 have a W/L ratio of 4/4, and that C1=500 fF, C2=150 fF holds. It is verified from FIG. 12 also that the desired operation is achieved.

Specifically, the capacitor C2 is precharged to 10 V (see "C2 PRECHARGED STATE" in FIG. 12) in the initial setup (precharge) interval (a period of 8 us from 37 to 45 us). The writing of data to the capacitor C1, which follows up the input data DATA (0.2 to 2.8 V), is completed in approximately 1 us(micro-second) (see the signal indicated by the black dots pointed to by arrow "C1" in FIG. 12).

In the ensuing evaluation interval (45 to 53 us), discharging of the capacitor C2 is completed in 0.5 us.

In the ensuing setup (precharge) interval (53 to 61 us), the capacitor C2 is precharged to 10 V again.

In the ensuing evaluation interval (61 to 69 us), the input data DATA is zero and therefore capacitor C2 is not discharged and maintains the high level (10 V).

By turning on the N-channel MOS transistor MN3, however, the charge in capacitor C2 is redistributed to the channel of the N-channel MOS transistor MN3 and falls as much as 0.5 V (indicated by "DROP OF 0.5 V OWING TO REDISTRIBUTION OF C2 CHARGE" in FIG. 12).

Figure 13A:
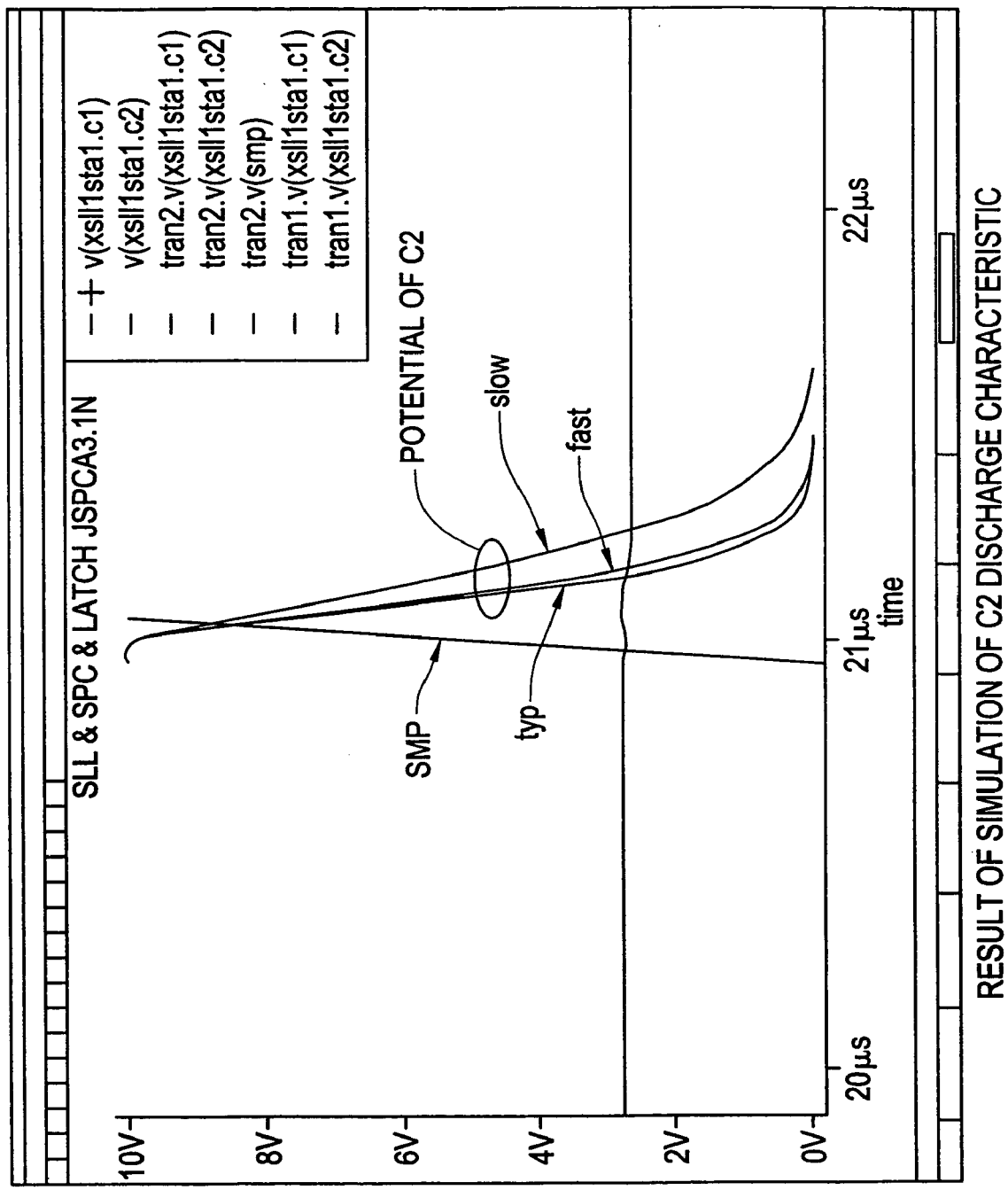

FIG. 13A illustrates the discharge characteristic of the capacitor C2 at the rising edge of the sampling pulse signal SMP in a case where the characteristic ["slow" (slow speed), "typ" (typical) and "fast" (high speed)] of the N-channel MOS transistor MN2 is adopted as a parameter.

It will be understood from FIG. 13A that discharge is completed in less than 1 us even in the worst case (slow) model.

Figure 13B:
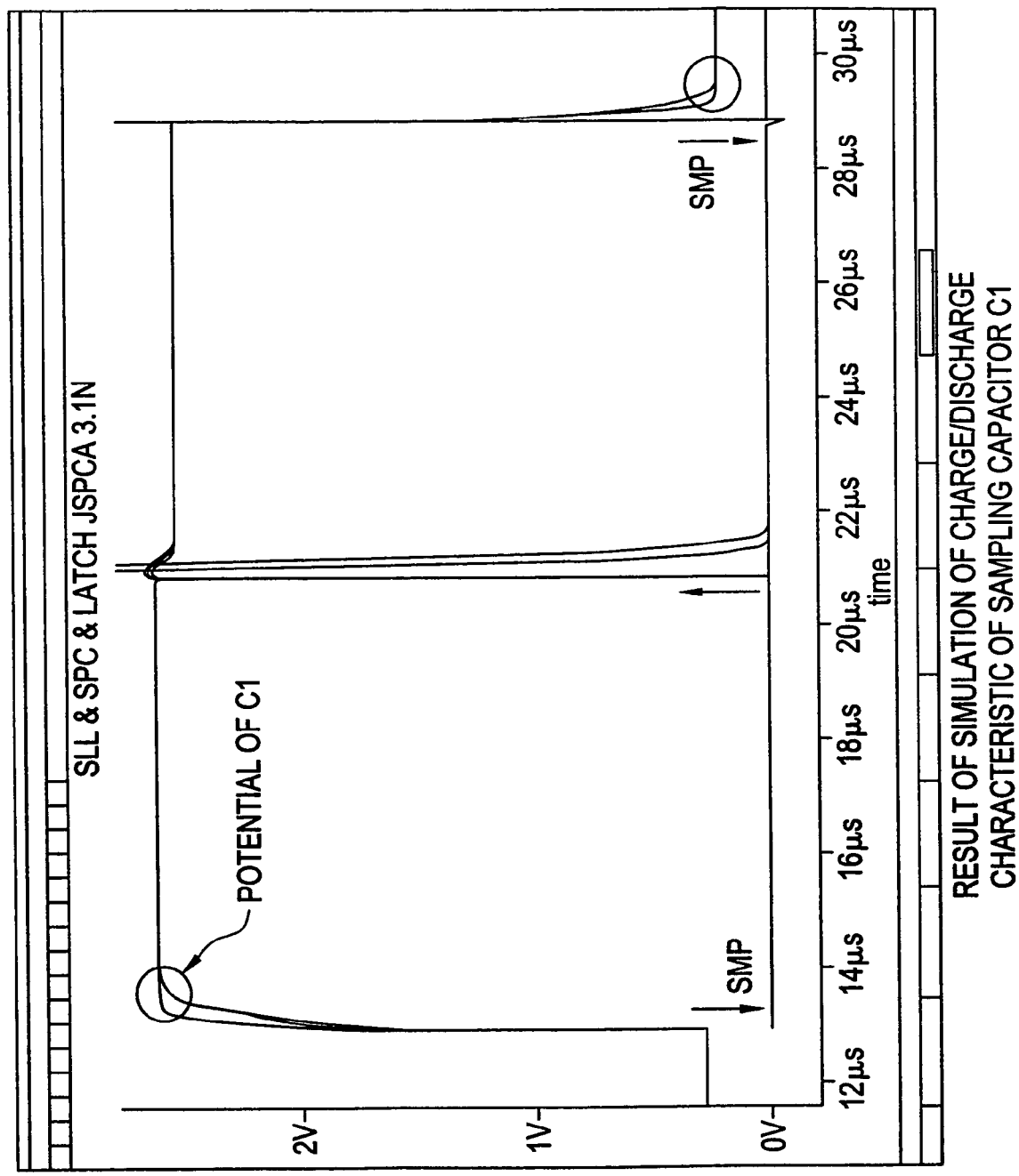

FIG. 13B illustrates the charge/discharge characteristic of the capacitor C1 in the sampling circuit at the rising and falling edges of the sampling pulse signal SMP based upon the characteristic ["slow" (slow speed), "typ" (typical) and "fast" (high speed)] of the transistor MN2. It will be understood that writing of the capacitor C1 also is completed in less than 1 us.

An example of specifications of the sampling level converter circuit and 2-phase expanding circuit according to the above-described embodiment of the invention is as follows:

input data width: 0 to 3 V;
output data amplitude: 0 to 10 V;
input data frequency: 125 KHz;
output data frequency: 62.5 KHz;
setup time: 1 $\mu$s;
control signals: SMP and inverted signal XSMP;
power-supplys: 10V power-supply and GND;
power consumption (total for 198 input circuits):
　0.006 mW (data is all "0"s);
　0.36 mW ("0"s and "1"s in identical proportion);
　0.69 mW (data is all "1"s).

Power consumption varies depending upon the input data and rises to a maximum of 0.69 mW (the total for 198 input circuits, where power consumption of 0.17 mW of signal SMP and inverted signal XSMP is excluded).

About half of the above-mentioned power consumption accompanies charging and discharging of the capacitor C2 for pre-charging. That is, most of the power consumption accompanies charging and discharging of capacitor C2. In the sampling level converter circuit, redistribution of the charge in capacitor C2 and leakage govern the lower limit of the operating frequency.

In the design of a sampling level converter circuit based upon this example, the capacitance of capacitor C2 is set to be somewhat large in order to enlarge the operating margin. In a case where consumption of power is to be reduced, the capacitance of capacitor C2 is set to be small.

Figure 14A:
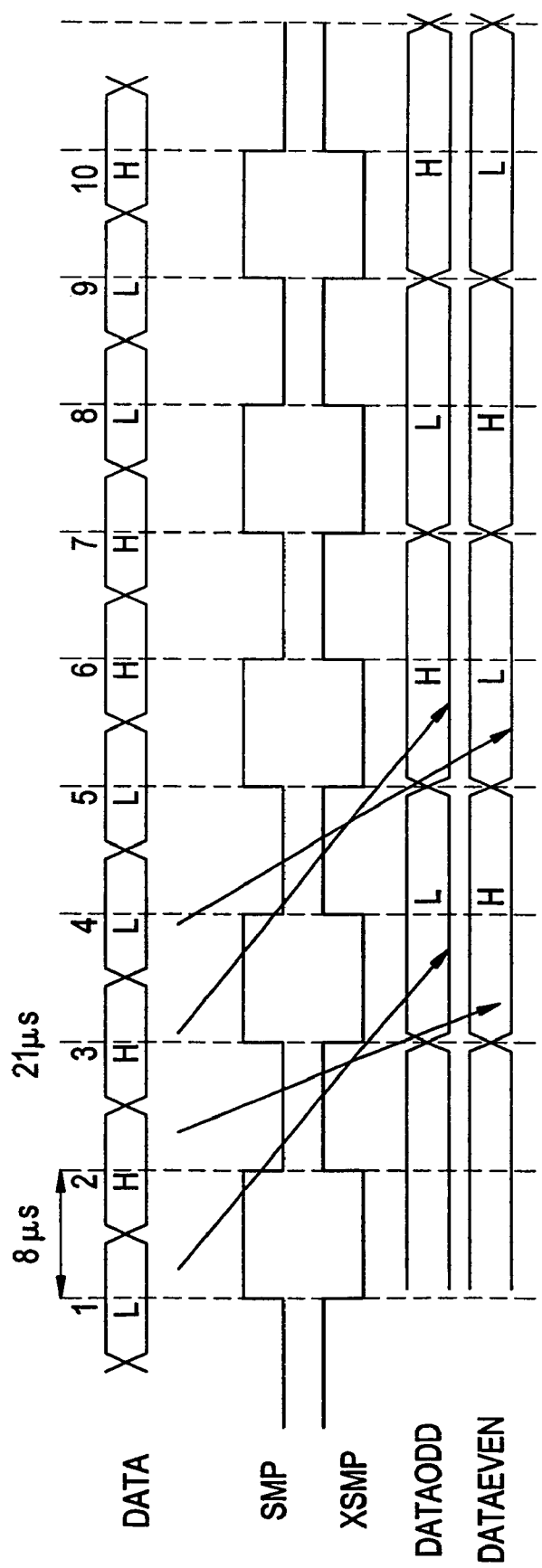
FIGS. 14A and 14B are diagrams illustrating the result of a simulation in which operation that is free of clock skew in the 2-phase expanding circuit of the third embodiment has been confirmed.
Figure 14B:
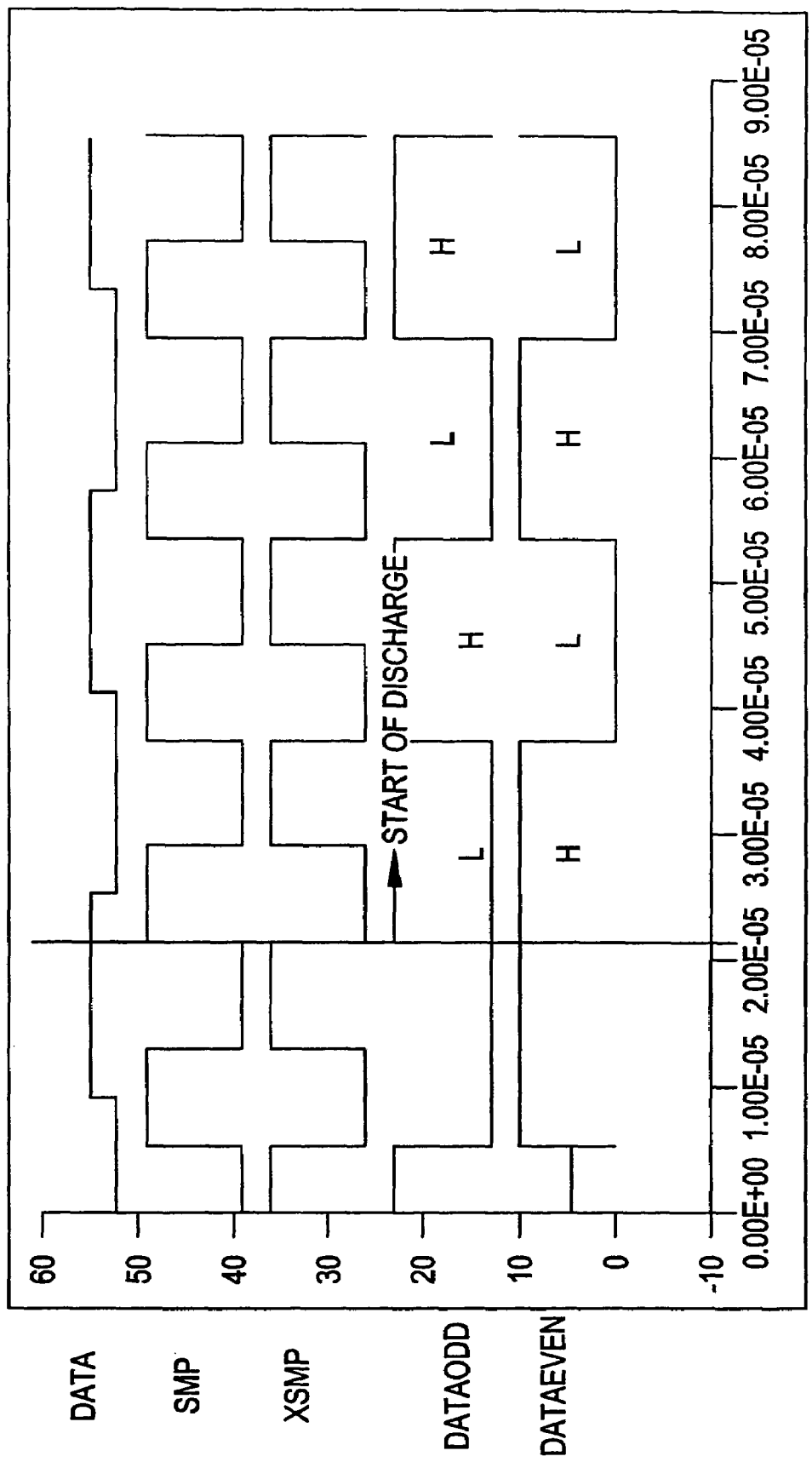

FIGS. 14A and 14B, and FIGS. 15A and 15B are diagrams illustrating the simulation result relating to clock-skew-free operation of the 2-phase expanding circuit of the embodiment illustrated in FIG. 7. FIG. 14A is a diagram illustrating the signal waveforms of a test vector (DATA, SMP, XSMP, DATAODD, DATAEVEN), and FIG. 14B illustrates the result of a simulation at the time of normal operation, which is independent of clock skew.

FIGS. 15A and 15B illustrate the results of simulation of operation of the 2-phase expanding circuit according to an embodiment of the invention in a case where the transition timing of the inverted signal XSMP lags behind the sampling pulse signal SMP by 2 us and in a case where the transition timing of the inverted signal XSMP leads the sampling pulse signal SMP by 2 us.

It can be verified from FIGS. 15A and 15B that even if the transition timing of the inverted signal XSMP deviates from the sampling pulse signal SMP by ±2 us, logic error does not occur and data identical with the data output of FIG. 14B is delivered, indicating that operation is normal.

An embodiment of a display device according to the present invention will now be described with reference to FIG. 16, which illustrates the structure of a liquid crystal display device having a sampling level converter circuit and 2-phase expanding circuit according to the present invention. This arrangement is contrived to lower the cost of the LCD (Liquid Crystal Display) module and to reduce power consumption. Since the digital/analog converter (DAC) 104 is mounted on the panel, the external controller IC 120 having a built-in memory is only a logic circuit. This means that a micro-fabrication process can be applied to the manufacture of the controller IC 120. This makes it possible to lower the power-supply voltage and reduce the chip size, thereby enabling a reduction in power consumption and cost.

Furthermore, the width of the data bus between the controller IC 120 and liquid crystal display panel 100 is made a large 198 bits, as shown in FIG. 16, and video digital data is transferred from a frame memory 121 to the liquid crystal display panel 100 via the data bus. Thus, the precharging frequency of the frame memory 121 is slowed down so that the power consumption of the controller IC 120 is reduced.

As shown in FIG. 16, the device includes the controller IC 120 having a controller 122 serving as a bus interface with respect to a host (CPU) and the frame memory 121 for storing one frame's worth of video information, and a DC-DC converter/grayscale power-supply circuit 130. The liquid crystal display panel (referred to also as a "display device substrate") 100 is provided with a sampling level converter circuit 101, to which data (0 to 3 V) of 198 bits (e.g., 33 pixels of video data, where the tone of each pixel is represented by six bits) transferred in parallel from the frame memory 121 is supplied, for level-converting the data to a signal having an amplitude of 0 to 10 V; a 2-phase expanding circuit 102, to which the output of the sampling level converter circuit 101 is supplied serially, for expanding this signal into two parallel bits; latch circuits 103 for latching the 396-bit output of the 2-phase expanding circuit 102; the DAC 104 (66 circuits) to which a signal of six bits [six bits which express tone (grayscale)] output from six latches 103 is supplied; and a selector 105, which receives outputs from the DAC 104 (i.e., from respective ones of the 66 circuits thereof) and has outputs the number of which is identical with the number of inputs on the column side (N columns) of a liquid crystal pixel array 110, for outputting a video signal to selected data lines sequentially in accordance with a selector control signal that is output from a timing-signal level shifter (level converter)106. The timing-signal level shifter 106 outputs sampling pulses SMP and XSMP of 0 to 10 V, a latch clock and the selector control signal. A shift register 108A and an output buffer 108B construct a vertical driver (scanning-line driver circuit) for driving the scanning lines of the liquid crystal pixel array 110. The DC-DC converter/grayscale power-supply circuit 130 supplies power to the sampling level converter circuit 101 and timing-signal level shifter 106. One pixel 111 of the liquid crystal pixel array 110 comprises, in case of an active-matrix LCD, a transistor (TFT) forming a switch and having a gate connected to a word line, a drain (source) connected to a data line and a source (drain) connected to a pixel electrode; a holding (auxiliary) capacitor; and a liquid crystal layer sealed between the pixel electrode and an opposing plate (COM) (the symbol consisting of the apex-to-apex triangles represents the capacitance of the liquid crystal).

Figure 17:
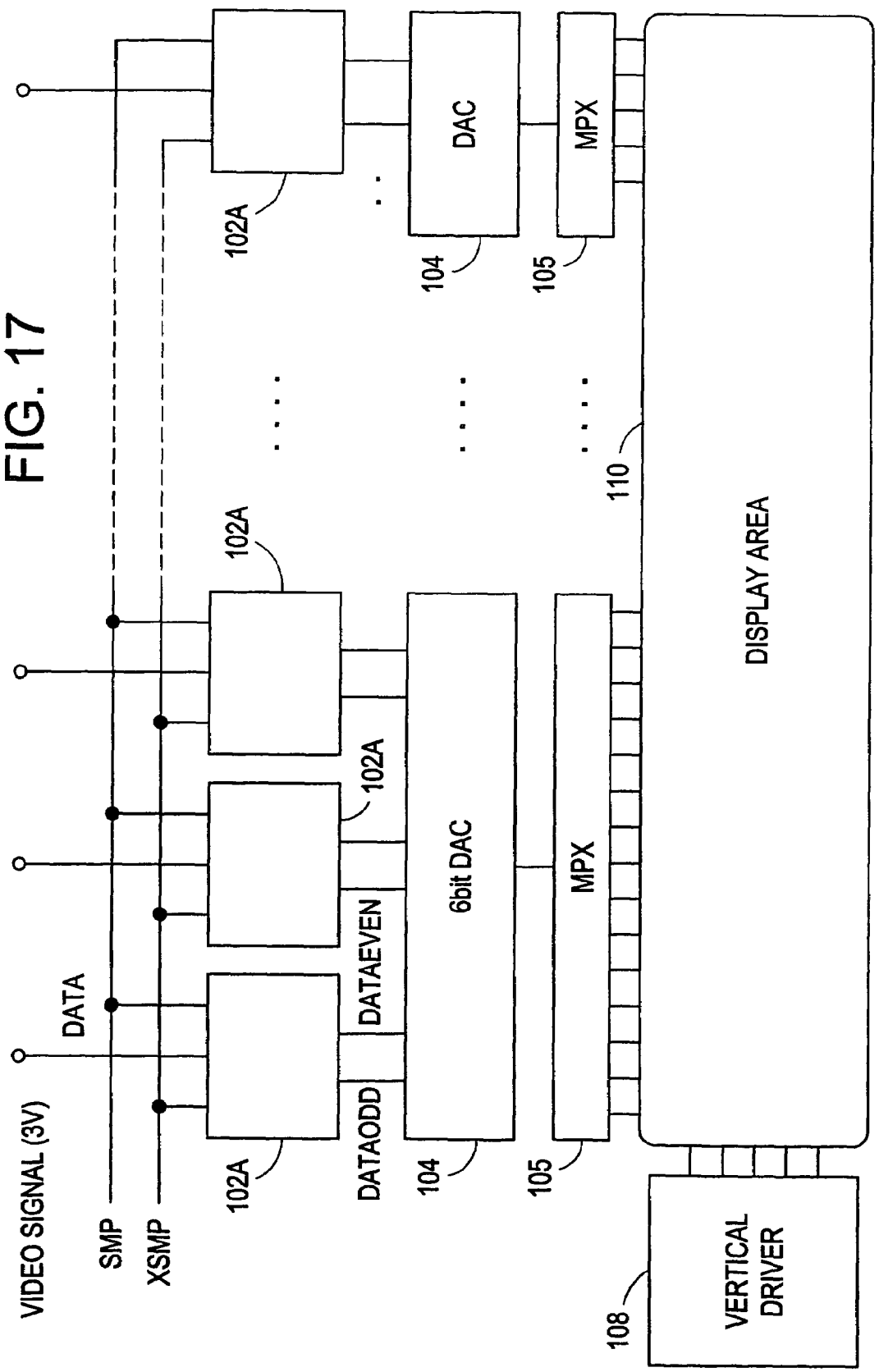
FIG. 17 is a diagram illustrating component peripheral to a 2-phase expanding circuit in an arrangement having a LCD with an internal DAC.

FIG. 17, which is an enlarged view of part of FIG. 16, illustrates the connections among the sampling level converter circuit, 2-phase expanding circuit and sampling pulse signals SMP and XSMP. In FIG. 17, sampling-level shifting/2-phase expanding circuits 102A use only the odd- and even-numbered uninverted signals DATAODD and DATAEVEN, and not the odd- and even-numbered inverted signals XDATAODD and XDATAEVEN as output signals from the arrangement having the sampling level converter circuit and 2-phase expanding circuit shown in FIG. 7. It is thus permissible to delete the inverter 20 that outputs the inverted signal XDATAODD and the inverter 29 that outputs the inverted signal XDATAEVEN from the arrangement shown in FIG. 7.

The sampling pulse signals SMP and its inverted counterpart XSMP are applied commonly to the sampling level converter circuit and 2-phase expanding circuit. The circuit 106 (FIG. 16) that level-shifts the timing signal from the controller may therefore employ a conventional circuit arrangement of the kind shown in FIGS. 23 and 24.

The outputs from three sampling-level shifting/2-phase expanding circuits 102A (which have the latches 103 in FIG. 16 provided on their output side) are input to the 6-bit DAC 104, and the output voltage of the DAC 104 is output to the data lines upon being selected sequentially (in terms of time) by the selector (MPX) 105.

Figure 18:
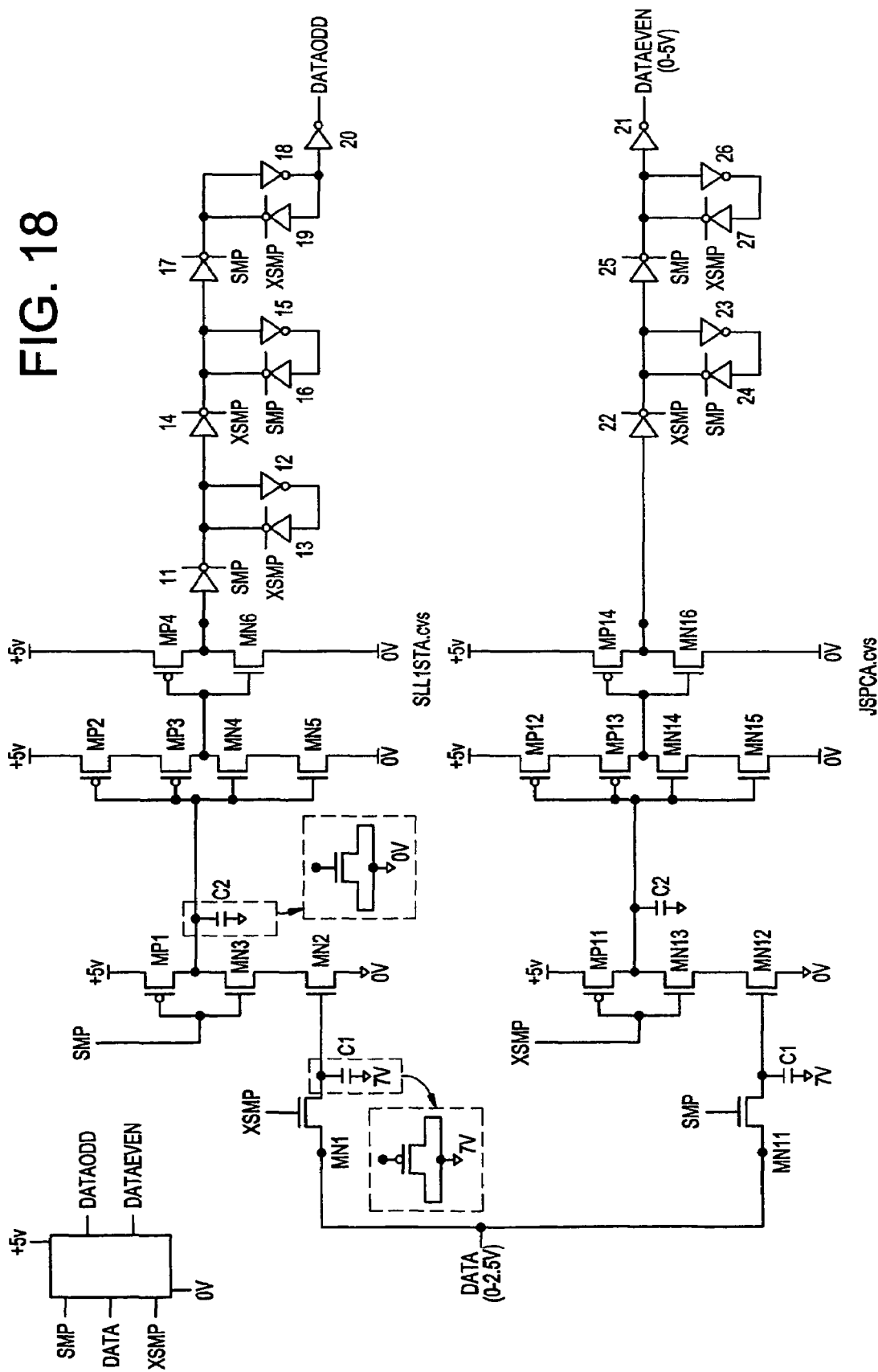
FIG. 18 is a diagram illustrating the structure of a 2-phase expanding circuit according to the third embodiment of the present invention.
Figure 19:
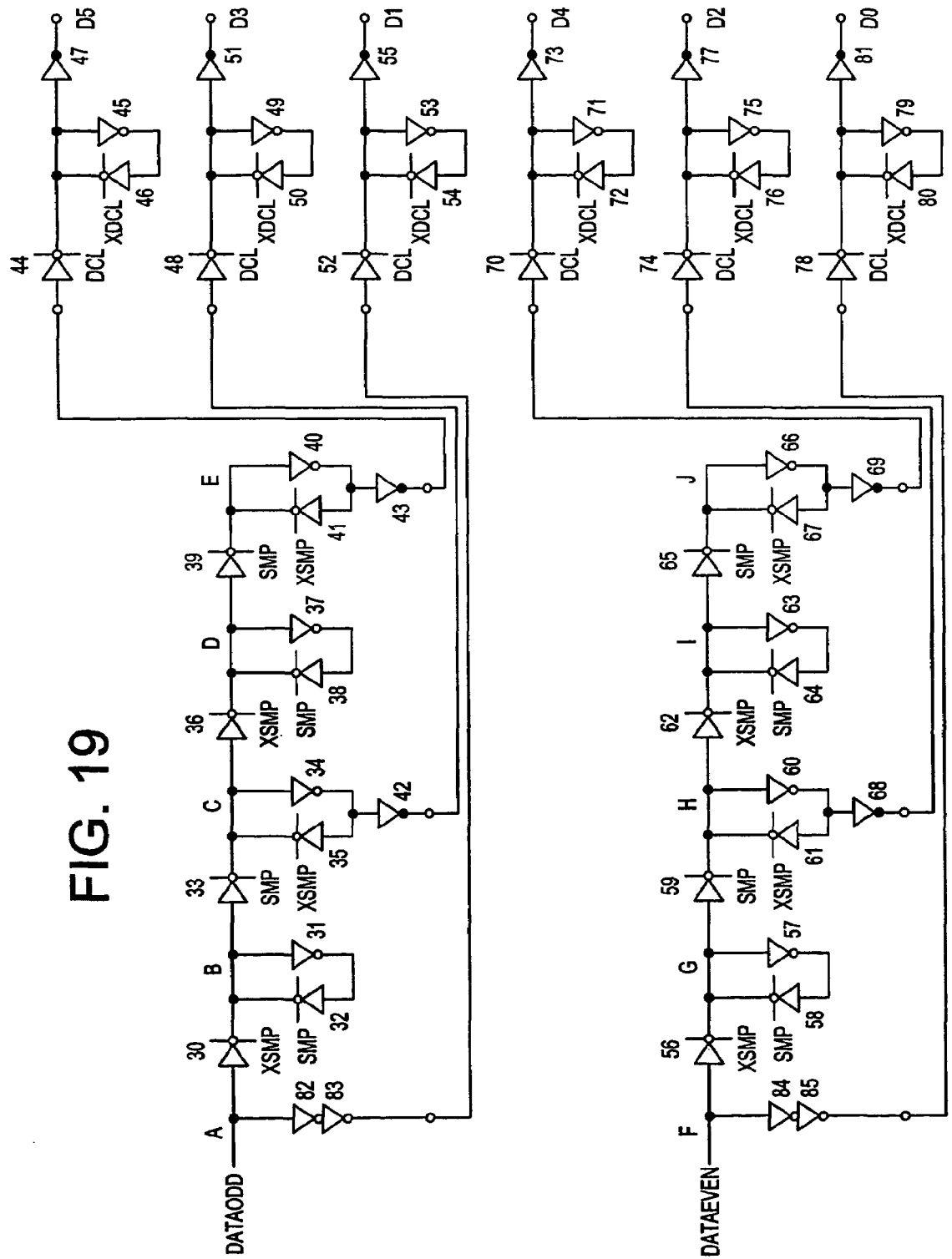
FIG. 19 is a diagram illustrating the structure of the 2-phase expanding circuit according to the third embodiment of the present invention.

Described next as a further embodiment of the present invention will be an example in which a 6-phase expanding circuit is constructed using sampling level converter circuits, inverters and latches according to the present invention. Reference will be had to FIGS. 18 and 19 into which the circuit has been divided to simplify the creation of the drawings.

The arrangement shown in FIG. 18 comprises the 2-phase expanding circuit shown in FIG. 7. The 2-phase expanding circuit is so adapted that odd and even uninverted signals DATAODD and DATAEVEN are output in parallel from an input signal in sync with the rising edge of the sampling pulse signal SMP. It should be noted that the sampling level converter circuit in the 2-phase expanding circuit shown in FIG. 18 is such that the capacitors C1 and C2 are composed of MOS capacitors.

In FIG. 19, the DATAODD channel has a node (A) to which the signal DATAODD is propagated from the 2-phase expanding circuit of FIG. 18. The signal at the node (A) is delayed by inverters 82 and 83. The DATAODD channel has a latch (which is made up of a clocked inverter 52, an inverter 53 and a clocked inverter 54) for outputting this signal at the rising edge of a signal DCL obtained by dividing the frequency of the input data (DATA) by 6, and an inverter 55 for outputting, as D1, a signal obtained by inverting the output of the latch.

The DATAODD channel further includes a first master/slave latch (which is made up of a clocked inverter 30, an inverter 31, a clocked inverter 32, clocked inverter 33, an inverter 34, and a clocked inverter 35) for sampling the potential at node A at the falling edge of the signal XSMP and for outputting the potential at the rising edge of the signal SMP, and a second master/slave latch (which is made up of a clocked inverter 36, an inverter 37, clocked inverter 38, a clocked inverter 39 (the output of which is a node E), an inverter 40, and a clocked inverter 41) for sampling the output (at node C) of the clocked inverter 33 at the falling edge of the signal XSMP and for outputting the signal at the rising edge of the signal SMP. The DATAODD channel further includes a latch (which is made up of a clocked inverter 48, an inverter 49, and a clocked inverter 50) for outputting, at the rising edge of the signal DCL, a signal that is the result of inverting the output of the inverter 34 of the first master/slave latch by an inverter 42, and an inverter 51 for outputting, as D2, a signal obtained by inverting the output of this latch. The DATAODD channel further includes a latch (which is made up of a clocked inverter 44, an inverter 45, and a clocked inverter 46) for outputting, at the rising edge of the signal DCL, a signal that is the result of inverting the output of the inverter 40 of the second master/slave latch by an inverter 43, and an inverter 47 for outputting, as D5, a signal obtained by inverting the output of this latch.

The DATAEVEN channel in FIG. 19 has a node (F) to which the signal DATAEVEN is transmitted from the 2-phase expanding circuit of FIG. 18. The signal at node (A) is delayed by inverters 84 and 85. The DATAEVEN channel has a latch (which is made up of a clocked inverter 78, an inverter 79, and a clocked inverter 80) for outputting this signal at the rising edge of the signal DCL obtained by dividing the input data by 6, and an inverter 81 for outputting, as D0, a signal obtained by inverting the output of the latch.

The DATAEVEN channel further includes a third master/slave latch (which is made up of a clocked inverter 56, an inverter 57, a clocked inverter 58, clocked inverter 59, an inverter 60, and a clocked inverter 61) for sampling the potential at node F at the falling edge of the signal XSMP and for outputting the potential at the rising edge of the signal SMP, and a fourth master/slave latch (which is made up of a clocked inverter 62, an inverter 63, a clocked inverter 64, a clocked inverter 65 (the output of which is a node J), an inverter 66, and a clocked inverter 67) for sampling the output (at node H) of the clocked inverter 59 at the falling edge of the signal XSMP and outputting the signal at the rising edge of the signal SMP. The DATAEVEN channel further includes a latch (which is made up of a clocked inverter 74, an inverter 75, and a clocked inverter 76) for outputting, at the rising edge of the signal DCL, a signal that is the result of inverting the output of the inverter 60 of the third master/slave latch by an inverter 68, and an inverter 77 for outputting, as D2, a signal obtained by inverting the output of this latch. The DATAEVEN channel further includes a latch (which is made up of a clocked inverter 70, an inverter 71, and a clocked inverter 72) for outputting, at the rising edge of the signal DCL, a signal that is the result of inverting the output of the inverter 66 of the fourth master/slave latch by an inverter 69, and an inverter 73 for outputting, as D4, a signal obtained by inverting the output of this latch.

Figure 20:
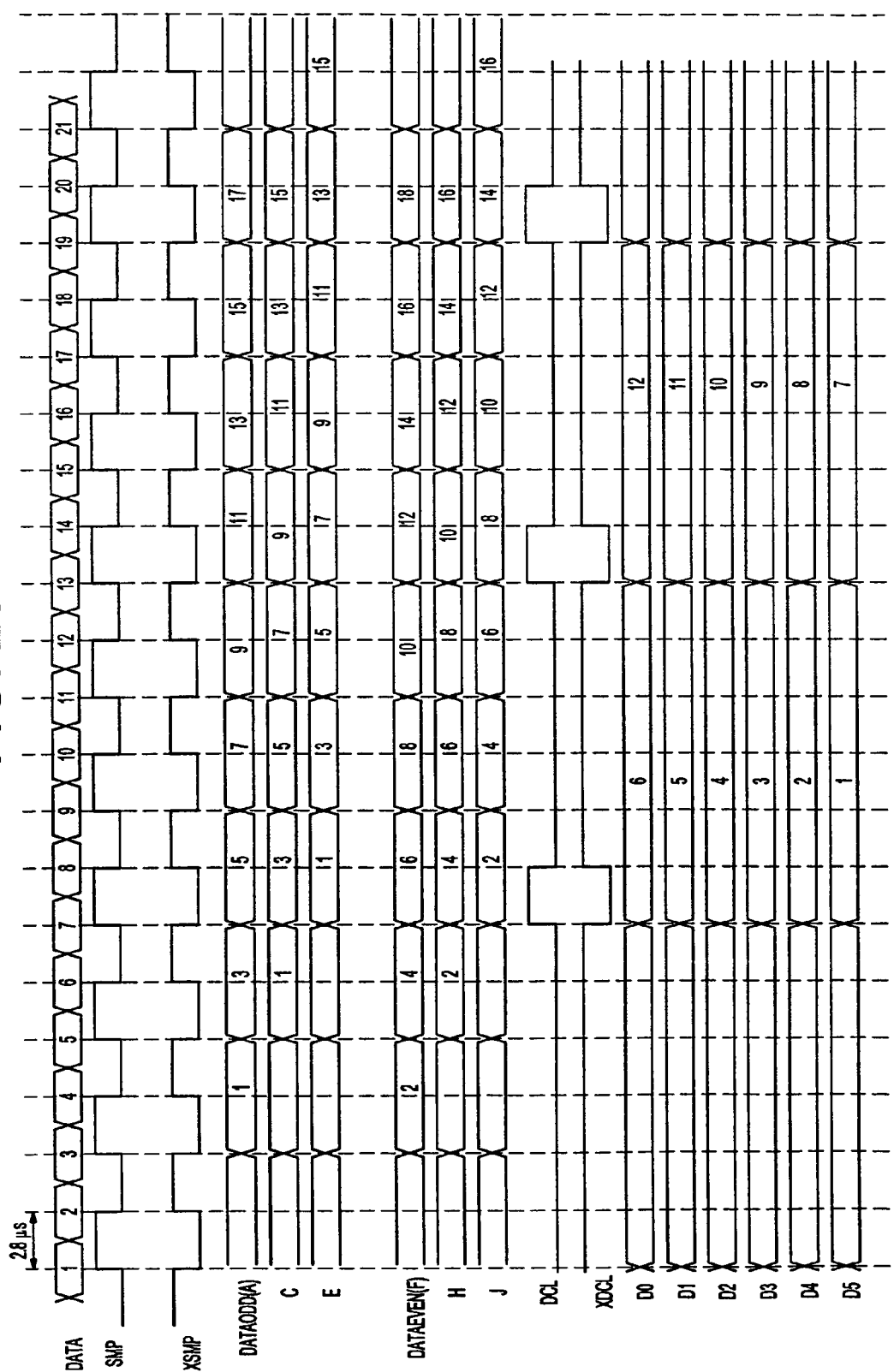
FIG. 20 is a diagram useful in describing the operation of the 2-phase expanding circuit according to the third embodiment.

FIG. 20 is a timing chart illustrating the operation of the 2-phase expanding circuit shown in FIGS. 18 and 19. Here DATAODD (node A) and DATAEVEN (node F) are generated from the input data DATA. At nodes C, E in the path of DATAODD, the signal at node A is delayed by one cycle and two cycles of the sampling pulse signal SMP respectively, and the data at nodes A, C and E is output as D1, D3 and D5 at the rising edge of DCL (i.e., at the timing at which input data 7 enters), which is the clock obtained by dividing the frequency of the input data by 6. At H, J in the path of DATAEVEN, the signal at node F is delayed by one cycle and two cycles of the sampling pulse signal SMP, and the data at nodes F, H and J is output as D0, D2 and D4 at the rising edge of DCL (i.e., at the timing at which input data 7 enters), which is the clock obtained by dividing the frequency of the input data by 6.

FIG. 21 is a diagram illustrating the structure of a sampling level converter circuit according to another embodiment of the present invention.

As shown in FIG. 21, the sampling level converter circuit according to this embodiment is such that the positions at which the evaluating element and detecting element are connected in the embodiment of FIG. 1 are interchanged. The evaluating N-channel MOS transistor MN2 that is turned on when the sampling pulse signal SMP is at the high level is disposed on the low-potential side (ground side), and the N-channel MOS transistor MN3 to the gate of which the terminal voltage of the capacitor C1 composing the sampling circuit is supplied is inserted between the drain of the P-channel MOS transistor MP1 for precharge control, the source of which is connected to the higher-potential power-supply (10 V), and the drain of the N-channel MOS transistor MN2 whose source is connected to the lower-potential power-supply.

The sampling level converter circuit of the embodiment shown in FIG. 1 is suited for a case where the amplitude (high-level voltage) of the signal (DATA) applied to the input terminal is close to the threshold voltage value VTH of the N-channel MOS transistor MN2. That is, the source of the N-channel MOS transistor MN2, to the gate of which the terminal voltage (input signal voltage) of capacitor C1 is supplied, is connected to the lower-potential power-supply (ground voltage), and the amplitude (terminal voltage of capacitor C1) of the signal applied to the input terminal becomes the gate-to-source voltage Vgs.

By contrast, in the circuit arrangement shown in FIG. 21, the source of the N-channel MOS transistor MN3 to the gate of which the amplitude (terminal voltage of capacitor C1) applied to the input terminal is supplied is connected to the lower-potential power-supply (ground potential) via the N-channel MOS transistor MN2. As a result, the gate-to-source voltage Vgs of the N-channel MOS transistor MN3 falls below the voltage of the input signal (DATA). For example, when the input signal sampled in the setup time-interval attains the high level in the output time-interval, in which the sampling pulse signal SMP is at the high level, the MOS transistor MN3 is turned on and the charge that has accumulated in the capacitor C2 is discharged via the N-channel MOS transistor MN2 (on-resistance $r_{on}$) that is in the ON state. The gate-to-source voltage Vgs takes on a value obtained by subtracting a voltage drop, which is due to the drain current I and on resistance $r_{on}$ of the N-channel MOS transistor MN2, from the voltage of the input signal (namely the terminal voltage of capacitor C1). Accordingly, this embodiment is applicable to a case where the amplitude (high-level voltage VIH) of the input signal is sufficiently higher than the threshold voltage VTH of the transistor MN3.

Further, by interchanging the connection positions of the N-channel MOS transistor MN2, which is the detecting element in FIG. 1, and the N-channel MOS transistor MN3, which is the evaluating element in FIG. 1, according to this embodiment, the fluctuation of the voltage that accompanies redistribution of the charge accumulated in capacitor C2 is reduced and the capacitance of the capacitor C2 is reduced further. More specifically, in a case where the gate potential of the N-channel MOS transistor MN3 is 0 V (the input signal voltage is at the low level) and the sampling pulse signal SMP is at the high level (10 V), the N-channel MOS transistor MN3 is turned off and, among stray capacitance Cs added to the terminal of capacitor C2, the parasitic capacitance Cn of MOS transistors exclusive of the P-channel MOS transistor MP1 becomes solely the gate-to-drain capacitance Cgd (MN3) of the N-channel MOS transistor MN3. This transistor, which has 0V applied to its gate, is in the OFF state. [Gate-to-bulk capacitance Cgb (MN3) need not be taken into consideration because the transistor MN3 is off.] The gate-to-drain capacitance Cgd (MN3) is substantially approximated as zero and is smaller than the parasitic capacitance Cn=(W·L)Cox of the N-channel MOS device in the foregoing embodiments described with reference to FIGS. 1 and 9. Accordingly, the combined value Cs of stray capacitance applied to the terminal of the capacitor C2 is smaller than that of the foregoing embodiment described with reference to FIG. 1.

The voltage drop *V after charge redistribution prevailing when the sampling pulse signal SMP is at the high level (10 V) is given by the following, as described earlier:

$$*V = V - V' = V \cdot Cs/(Cs+C2)$$

That is, according to this embodiment, the fact that the combined value Cs of stray capacitance is small means that the capacitance of capacitor C2 required to set a certain value *V can be made small in comparison with the arrangement shown in FIG. 1.

The basic operation of the sampling level converter circuit illustrated in FIG. 21 is similar to that of the embodiment described above with reference to FIG. 1 and need not be described again.

FIG. 22 is a diagram illustrating the structure of a multiphase (n-phase) expanding circuit according to another embodiment of the present invention.

As shown in FIG. 22, this embodiment expands the serial data of a low-amplitude logic signal (0 to 3 V) to n phases. This expanding circuit includes n-number of sampling level converter circuits, which have two outputs of a shift register 1010 input thereto as the sampling pulse signals XSMP and SMP, and which have their input terminals connected to a data line (DATA); n-number of first latch circuits for latching respective ones of the outputs of the n-number of sampling level converter circuits based upon output signals A2, A3, and A4 of the shift register 1010; and n-number of second latch circuits for latching respective ones of the outputs of the first latch circuits at latch timing signal DCL, which is obtained by dividing the frequency of data signal by n.

More specifically, the shift register 1010 has parallel outputs A1 to An +1(outputs up to A4 are illustrated in FIG. 22). Among these, the signal A1 is supplied to the gate of an N-channel MOS transistor MN101 that samples a capacitor C101, and the signal A2 is supplied to the gates of a P-channel MOS transistor MP101 and N-channel MOS transistor MN103. There is provided an N-channel MOS transistor MN102 having a source connected to ground potential, a drain connected to the source of the N-channel MOS transistor MN103 and a gate connected to the terminal voltage (the voltage at node B) of capacitor C101 of the sampling circuit. The source of the P-channel MOS transistor MP101 is connected to the power-supply of 10 V, and a capacitor C102 is connected to the point of connection between the drain of the P-channel MOS transistor MP101 and drain of the N-channel MOS transistor MN103. This constructs a sampling level converter circuit. This sampling level converter circuit has a circuit arrangement the same as that of FIG. 1 but differs in control of the sampling signals supplied. Signal A2, which corresponds to the sampling pulse signal SMP, lags signal A1 (which corresponds to the sampling pulse XSMP) by one clock of the shift register 1010, and the signal A1 is not the inverse of signal A2.

A first latch circuit is comprised of a clocked inverter 211, to which the terminal voltage (the voltage at node C) of capacitor C102 of the sampling level converter circuit is supplied, for being turned on by the high level of the signal A2, thereby inverting its input signal and outputting the inverted signal; an inverter 212 to which the output of the clocked inverter 211 is supplied; and an inverter 213, to which the output of the inverter 212 is supplied, for being turned on when the signal A2 is at the low level, thereby inverting its input signal and outputting the inverted signal.

The first latch outputs the input data (the inverted signal at node C) at the rising edge of the high level of signal A2 and stores the data when the signal A2 is at the low level. A second latch circuit is comprised of a clocked inverter 214, to the input terminal of which the output (at node D) of the first latch is connected, for being turned on at the high level of clock DCL, which is obtained by dividing the frequency of the data signal by n, thereby inverting its input signal and outputting the inverted signal; an inverter 215 to which the output of the clocked inverter 214 is supplied; and a clocked inverter 216, to which the output of the inverter 215 is supplied, for being turned on when the signal DCL is at the low level, thereby inverting its input signal and outputting the inverted signal. The second latch circuit outputs the inverse of the input data (i.e., the state at node D) at the rising edge of the high level of signal DCL and stores the output data when the signal DCL is at the low level.

A sampling level converter circuit (which comprises N-channel MOS transistors MN201, MN202 and MN203, a P-channel MOS transistor MP201 and capacitors C201, and C202), to which the output signals A2 and A3 of shift register 1010 are supplied, a first latch circuit (311, 312 and 313) and a second latch circuit (314, 315 and 316) are similar to the above-described sampling level converter circuit and first and second latch circuits, respectively.

A sampling level converter circuit (which comprises N-channel MOS transistors MN301, MN302 and MN303, a P-channel MOS transistor MP301 and capacitors C301 and C302) to which the output signals A3 and A4 of shift register 1010 are input, a first latch circuit (411, 412 and 413) and a second latch circuit (414, 415 and 416) are similar to the above-described sampling level converter circuit and first and second latch circuits, respectively.

Thus, in this embodiment, signals of two mutually adjacent phases from among signals of (n+1)-number of phases, which are shifted from one another by one data cycle, output from a shift register are supplied to sampling level converter circuits as the sampling pulse signals XSMP and SMP. First latch circuits latch data at whichever of the sampling pulses lags in terms of phase and output the data in sync with a clock DCL, which is the result of dividing the frequency of the data signal by n, whereby n-phase parallel signals are output. It should be noted that the shift register 1010 may be constituted by (n+1)-number of D-type flip-flop stages, and it may be so arranged that sampling pulse signals (Ai, Ai+1) are supplied to the n-number of sampling level converter circuits, where Ai represents the output of the i-th D-type flip-flop. The circuit that generates the signal Ai is not limited to a shift register. Use may be made of any circuit that generates a multiphase clock in which the phases are stagger from one another by one data cycle.

Figure 23:
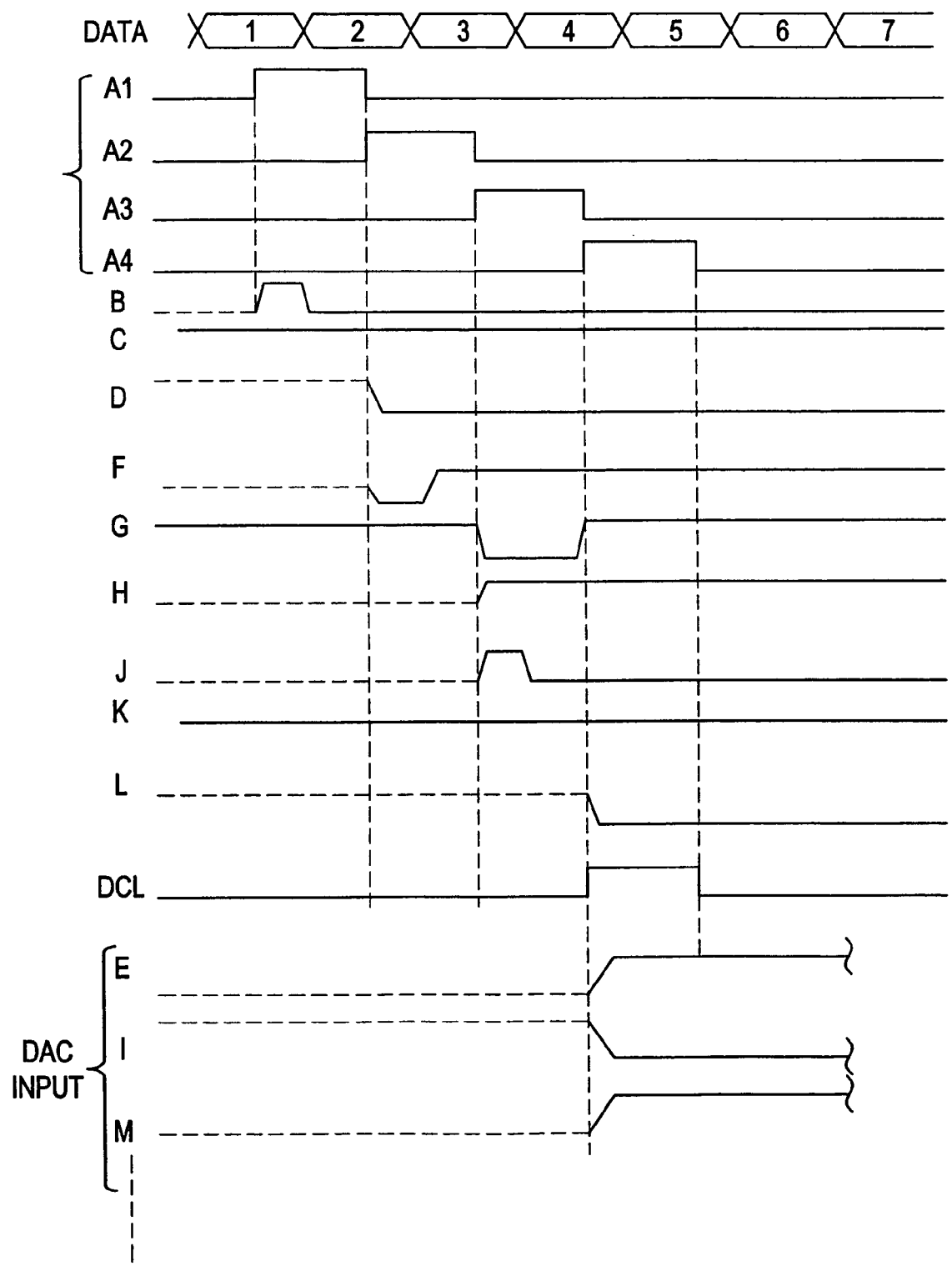
FIG. 23 is a diagram useful in describing the operation of an n-phase expanding circuit according to another embodiment of the present invention.

FIG. 23 is a diagram illustrating some of the transitions of the signal waveforms at the nodes in the circuit of FIG. 22. With regard to the sampling level converter circuit of the second stage, the MOS transistor MN201 is turned on at the timing of the rising edge of signal A2 from the shift register 1010. Since the signal A3 is at the low level at this time, the MOS transistor MP201 is turned on, the MOS transistor MN203 is turned off and the node G is precharged to 10 V. The high level (3 V) of data signal (2) is sampled at the node F of the sampling circuit (this is the setup time-interval).

Next, the signal A3 rises after a delay of one data cycle relative to the rising edge of the signal A2, the MOS transistor MP201 of the sampling level converter circuit is turned off, the MOS transistor MN203 is turned on and the output time-interval starts. The gate potential of MOS transistor MN202 is made 3 V, the MOS transistor MN202 is turned on, the accumulated electric charge of capacitor C202 (the electric charge to which this capacitor was precharged in the setup time-interval) is discharged to ground via the MOS transistors MN203 and MN202, and the potential at node G becomes 0 V. The clocked inverter 311 is turned on at the rising edge of signal A3 and the high level, which is a logic value obtained by inverting the terminal voltage of the capacitor C202, is output at the node H.

Next, the signal A3 falls to the low level and the flip-flop made up of inverters 312 and 313 store the state (the high level) at node H. At the same time, the capacitor C202 at node G is precharged to the power-supply voltage (10 V) to prepare for the next operation.

Data sampled sequentially at the nodes D, H, L, . . . is latched in accordance with the outputs A2, A3, A4, . . . of shift register 1010. At the moment latching of the n items of data supplied serially to the data line (DATA) is completed, the latch timing signal DCL is supplied commonly to the n-number of second latch circuits and n-bit parallel data is output from the n-number of second latch circuits in sync with the rising edge of the signal DCL. That is, in the example depicted in FIG. 23, the output nodes E, I, and M of the second latch circuit assume high, low and high levels, respectively, at the rising edge of the latch timing signal DCL.

In the example shown in FIG. 22, the n-bit parallel outputs from the n-number of second latch circuits are supplied to a DAC circuit 1020. As a matter of course, however, the destination of the outputs from the n-phase expanding circuit is not limited to a DAC circuit.

In the foregoing embodiments, a level converter circuit, 2-phase expanding circuit and 6-phase expanding circuit that employ polysilicon TFTs as the transistors have been described. However, CMOS circuits formed on a polysilicon substrate may be employed as a matter of course. Further, it goes without saying that the present invention is applicable also to an arrangement in which discrete electronic components such as individual semiconductor elements and capacitors, rather than an integrated circuit, are mounted on a circuit board.

A liquid crystal display device and the data-line driver thereof have been described by way of example with reference to FIGS. 16 and 17. However, the present invention is similarly applicable to an organic EL display device of active matrix type.

Furthermore, examples have been described in which the amplitude of the input signal is 0 to 3 V and the amplitude of the output is 0 to 10 V. However, the present invention is not limited to such an arrangement.

Further, in addition to the above-mentioned 2- and 6-phase expanding circuits, a circuit for achieving an expansion to 2N phases can be constructed in similar fashion. Depending upon the n-phase expanding circuit, it is possible to implement an expansion to any number of phases.

Furthermore, clocked inverters (e.g., clocked inverters 13, 16, etc., in FIG. 3) that compose a flip-flop (two inverters in which the input of one is connected to the output of the other) of the master/slave latch may be replaced by transfer switches, which are turned on and off by the sampling pulse signal SMP and its inverted counterpart XSMP, and an inverter, and the clocked inverters (e.g., clocked inverters 11, 14, etc., in FIG. 3) that turn signal transmission in the latches on and off may be constituted by transfer gates.

Though the present invention has been described in line with the foregoing embodiments, the invention is not limited to these embodiments and it goes without saying that the invention covers various modifications and changes that would be obvious to those skilled in the art within the scope of the claims.

The meritorious effects of the present invention are summarized as follows.

Thus, in accordance with the sampling level converter circuit of the present invention as described above, power consumption can be reduced by so arranging it that a steady current does not flow. In addition, adopting single-phase signal input reduces the number of connection terminals.

Furthermore, in accordance with the sampling level converter circuit, 2-phase expanding circuit and multiphase expanding circuit according to the present invention, drive is simplified and additional power-supplys are unnecessary. The invention is ideal for use as, e.g., a 3-V interface for an external controller and as an interface for a DAC array mounted on a display such as a LCD module.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A sampling level converter circuit comprising:
   a switch element inserted in a charging path of an output node, wherein the switch element inserted in the charging path of the output node is turned on in a setup time-interval based on a sampling control signal supplied thereto, thereby precharging the output node to a voltage of a higher-potential power-supply;
   a switch element inserted in a discharging path of the output node; and
   means for sampling an input signal voltage;
   wherein the discharging path of the output node is held in an off state based upon the sampling control signal in the setup time-interval;
   the switch element inserted in the discharging path of the output node is turned on and off in accordance with a logic value of the input signal voltage sampled in the setup time-interval, in an output time-interval specified by the sampling control signal;
   when the switch element inserted in the discharging path is turned on, the discharging path is set in an on state, thereby discharging the precharged output node; and
   when the switch element inserted in the discharging path is turned off, no discharging of the precharged output node takes place.

2. A sampling level converter circuit comprising:
   first, second and third switch elements connected serially between a higher-potential power-supply and a lower-potential power-supply;
   a first capacitor connected to a connection node of said first and second switch elements;
   a fourth switch element connected between an input terminal, to which an input signal is supplied, and a control terminal of said third switch element; and
   a second capacitor connected to a connection node of the control terminal of said third switch element and said fourth switch element;

wherein a first sampling control signal is supplied in common to both a control terminal of said first switch element and a control terminal of said second switch element, whereby one of said first and second switch elements is turned off when the other is turned on;

a second sampling control signal is supplied to a control terminal of said fourth switch, wherein said input signal is sampled during a setup time-interval; and an output signal is derived directly or indirectly from a terminal voltage of said first capacitor, wherein, during an output time-interval, said third switch element controls a discharging path for said first capacitor in accordance with a logic value of the input signal sampled during the setup time-interval.

3. A sampling level converter circuit comprising:

first, second and third switch elements connected serially between a higher-potential power-supply and a lower-potential power-supply;

a first capacitor connected to a connection node of said first and second switch elements;

a fourth switch element connected between an input terminal, to which an input signal is supplied, and a control terminal of said second switch element; and a second capacitor connected to a connection node of the control terminal of said second switch element and said fourth switch element;

wherein a first sampling control signal is supplied in common to both a control terminal of said first switch element and a control terminal of said third switch element, whereby one of said first and second switch elements is turned off when the other is turned on;

a second sampling control signal is supplied to a control terminal of said fourth switch, wherein said input signal is sampled during a setup time-interval; and an output signal is derived directly or indirectly from a terminal voltage of said first capacitor, wherein, during an output time-interval, said third switch element controls a discharging path for said first capacitor in accordance with a logic value of the input signal sampled during the setup time-interval.

4. A sampling level converter circuit comprising:

first, second and third switch elements connected serially between a higher-potential power-supply and a lower-potential power-supply;

a first capacitor connected to a connection node of said first and second switch elements;

a fourth switch element connected between an input terminal, to which an input signal is supplied, and a control terminal of said third switch element; and a second capacitor connected to a connection node of a control terminal of said third switch element and said fourth switch element;

wherein a first sampling control signal is supplied in common to both a control terminal of said first switch element and a control terminal of said second switch element; and when the first sampling control signal is a second logic value, said first switch element is turned on, said second switch element is turned off and said first capacitor is charged to the voltage of the higher-potential power-supply;

wherein a second sampling control signal is supplied to a control terminal of the fourth switch element; and when the second sampling control signal is a first logic value, said fourth switch element is turned on and said second capacitor is charged by the input signal voltage; and wherein when the first sampling control signal is the first logic value, said first switch element is turned off, and said second switch element is turned on, and an output signal is derived directly or indirectly from a terminal voltage of said first capacitor prevailing at the time when the first sampling control signal is the first logic value.

5. A sampling level converter circuit comprising:

first, second and third switch elements connected serially between a higher-potential power-supply and a lower-potential power-supply;

a first capacitor connected to a connection node of said first and second switch elements;

a fourth switch element connected between an input terminal, to which an input signal is supplied, and a control terminal of said second switch element; and a second capacitor connected to a connection node of the control terminal of said second switch element and said fourth switch element;

wherein a first sampling control signal is supplied in common to both a control terminal of said first switch element and a control terminal of said third switch element, and when the first sampling control signal is a second logic value, said first switch element is turned on, said third switch element is turned off and said first capacitor is charged to the voltage of the higher-potential power-supply;

wherein a second sampling control signal is supplied to a control terminal of said fourth switch element; and when the second sampling control signal is a first logic value, said fourth switch element is turned on and said second capacitor is charged by the input signal voltage; and wherein when the first sampling control signal is the first logic value, said first switch element is turned off, and said third switch element is turned on; and an output signal is derived directly or indirectly from a terminal voltage of said first capacitor prevailing at the time when the first sampling control signal is the first logic value.

6. The circuit according to claim 2, wherein the second sampling control signal is a signal obtained by inverting the first sampling control signal.

7. The circuit according to claim 2, further comprising a buffer circuit, for receiving the terminal voltage of said first capacitor as an input, and for outputting a signal having an amplitude corresponding to the higher-potential power-supply voltage and the lower-potential power-supply voltage.

8. The circuit according to claim 2, further comprising a first transfer switch for receiving, as an input signal supplied thereto, the terminal voltage of said first capacitor or an output signal from a buffer circuit to which the terminal voltage of said first capacitor is supplied, and for outputting a signal having an amplitude specified by the higher-potential power-supply voltage and the lower-potential power-supply voltage, said first transfer switch being turned on to output the input signal supplied thereto when the first sampling control signal is the first logic value, and being turned off when the first sampling control signal is the second logic value.

9. The circuit according to claim 8, further comprising:
a master latch comprising:
  said first transfer switch; and
  a flip-flop for receiving an output signal from said first transfer switch and for storing the value of the output when the second sampling control signal is the first logic value; and
a slave latch comprising:
  a second transfer switch for receiving an output signal from said first transfer switch, said second transfer switch being turned on to output the output signal of said first transfer switch when the second sampling control signal is the first logic value, and being turned off when the second sampling control signal is the second logic value; and
  a flip-flop for receiving an output signal from said second transfer switch, and for storing the value of the output signal from said second transfer switch when the first sampling control signal is the first logic value.

10. The circuit according to claim 7, wherein said buffer circuit comprises an even number of cascade-connected inverters.

11. The circuit according to claim 8, wherein said first transfer switch comprises a clocked inverter, which is turned on when the first sampling control signal is the first logic value, for inverting a signal supplied thereto and for outputting the inverted signal.

12. The circuit according to claim 9, wherein said second transfer switch comprises a clocked inverter, which is turned on when the second sampling control signal is the first logic value, for inverting a signal supplied thereto and for outputting the inverted signal.

13. The circuit according to claim 1, wherein an amplitude-voltage of the input signal supplied to the input terminal is less than a voltage of the higher-potential power-supply.

14. The circuit according to claim 1, wherein each of said switch elements comprises a thin-film transistor.

15. A 2-phase expanding circuit comprising:
  first and second sampling level converter circuits, each composed by the sampling level converter circuit according to claim 2;
  wherein an input signal is applied commonly to both of said first and second sampling level converter circuits; and
  signals of values obtained by inverting values of first and second sampling control signals of said first sampling level converter circuit are supplied as the first and second sampling control signals to control terminals of respective ones of corresponding switch elements in said second sampling level converter circuit;
  said 2-phase expanding circuit further comprising:
    a first master/slave latch for storing an output signal of said first sampling level converter circuit based upon the first sampling control signal, and for outputting the stored signal based upon the second sampling control signal;
    a latch for delivering the output signal of the first master/slave latch based upon the first sampling control signal; and
    a second master/slave latch for storing an output signal of said second sampling level converter circuit based upon the second sampling control signal, and for outputting the stored signal based upon the first sampling control signal.

16. A 2-phase expanding circuit comprising:
a first sampling level converter circuit comprising:
  first to third switch elements connected serially between a higher-potential power-supply and a lower-potential power-supply;
  a first capacitor connected to a connection node of said first and second switch elements;
  a fourth switch element connected between an input terminal, to which an input signal is supplied, and a control terminal of said third switch element; and
  a second capacitor connected to a connection node of the control terminal of said third switch element and said fourth switch element;
  wherein a first sampling control signal is supplied in common to both a control terminal of said first switch element and a control terminal of said second switch element; and
  a second sampling control signal, which is the complement to the first sampling control signal, is supplied to a control terminal of said fourth switch;
  a first group of inverters of an even number of stages connected in cascade, an initial stage of the inverters receiving terminal voltage of said first capacitor supplied thereto;
  a first master/slave latch for storing an output signal of a final stage of said first group of inverters when the first sampling control signal is a first logic value, and for outputting the stored signal when the second sampling control signal is the first logic value;
  a first latch for receiving the output signal from said first master/slave latch, and for outputting the signal received as an odd-numbered signal when the first sampling control signal is the first logic value;
a second sampling level converter circuit comprising:
  fifth sixth and seventh switch elements connected serially between the higher-potential power-supply and the lower-potential power-supply;
  a third capacitor connected to a connection node of said fifth and seventh switch elements;
  an eighth switch element connected between the input terminal, to which the input signal is supplied, and a control terminal of said seventh switch element; and
  a fourth capacitor connected to a connection node of the control terminal of said seventh switch element and said eighth switch element;
  wherein the second sampling control signal is supplied in common to both a control terminal of said fifth switch element and a control terminal of said sixth switch element; and
  the first sampling control signal is supplied to a control terminal of said eighth switch;
  a second group of inverters of an even number of stages connected in cascade, an initial stage of the inverters receiving terminal voltage of said third capacitor supplied thereto; and
  a second master/slave latch for storing an output signal of a final stage of said second group of inverters when the second sampling control signal is the first logic value, and for outputting the stored signal as an even-numbered signal when the first sampling control signal is the first logic value, and
  the odd-numbered signal and the even-numbered signal being output in parallel in sync with transition of the first sampling control signal to the first logic value.

17. A multi-phase expanding circuit comprising:
a first sampling level converter circuit comprising:
  first, second and third switch elements connected serially between a higher-potential power-supply and a lower-potential power-supply;
  a first capacitor connected to a connection node of said first and second switch elements;
  a fourth switch element connected between an input terminal, to which an input signal is supplied, and a control terminal of said third switch element; and
  a second capacitor connected to a connection node of the control terminal of said third switch element and said fourth switch element;
  wherein a first sampling control signal is supplied in common to both a control terminal of said first switch element and a control terminal of said second switch element; and
  a second sampling control signal, which is the complement to the first sampling control signal, is supplied to a control terminal of said fourth switch;
a first group of inverters of an even number of stages connected in cascade, an initial stage of the inverters receiving terminal voltage of said first capacitor supplied thereto;
a first master/slave latch for storing an output signal of a final stage of said first group of inverters when the first sampling control signal is a first logic value, and for outputting the stored signal when the second sampling control signal is the first logic value;
a first latch for receiving the output signal from said first master/slave latch, and for outputting the signal received as an odd-numbered signal when the first sampling control signal is the first logic value;
a second sampling level converter circuit comprising:
  fifth, sixth and seventh switch elements connected serially between the higher-potential power-supply and the lower-potential power-supply;
  a third capacitor connected to a connection node of said fifth and seventh switch elements;
  an eighth switch element connected between the input terminal, to which the input signal is supplied, and a control terminal of said seventh switch element; and
  a fourth capacitor connected to a connection node of the control terminal of said seventh switch element and said eighth switch element;
  wherein the second sampling control signal is supplied in common to both a control terminal of said fifth switch element and a control terminal of said sixth switch element; and
  the first sampling control signal is supplied to a control terminal of said eighth switch;
a second group of inverters of an even number of stages connected in cascade, an initial stage of the inverters receiving terminal voltage of said third capacitor supplied thereto;
a second master/slave latch for storing an output signal of a final stage of said second group of inverters when the second sampling control signal is the first logic value, and for outputting the stored signal as an even-numbered signal when the first sampling control signal is the first logic value;
wherein the odd-numbered signal and the even-numbered signal are output in parallel in sync with transition of the first sampling control signal to the first logic value;
a first group of master/slave latches of M-number of stages connected in cascade, for storing an input signal applied thereto when the second sampling control signal is the first logic value, and for outputting the stored signal when the first sampling control signal is the first logic value; the odd-numbered signal being supplied to a first stage of said first group of master/slave latches;
a first group of latches of (M+1)-number, arranged in parallel for latching the odd-numbered signal and respective ones of outputs from said first group of master/slave latches in response to a third signal obtained by frequency-dividing the frequency of the input signal by 2(M+1);
a second group of master/slave latches of M-number of stages connected in cascade, for storing an input signal applied thereto when the second sampling control signal is the first logic value, and for outputting the stored signal when the first sampling control signal is the first logic value;
the even-numbered signal being supplied to a first stage of said second group of master/slave latches; and
a second group of latches of (M+1)-number, arranged in parallel for latching the even-numbered signal and respective ones of outputs from said second group of master/slave latches in response to the third signal,
whereby signals that have been expanded into 2(M+1)-number of phases are output in parallel from said first and second groups of latches at cycles obtained by frequency-dividing the frequency of the input signal by 2(M+1).

18. A n-phase expanding circuit comprising:
n-number (where n is a predetermined positive integer equal to or greater than 2) of the sampling level converter circuits according to claim 2;
a data signal line being connected in common with the input terminals of said n-number of sampling level converter circuits;
a circuit for generating multiphase clock signals in which mutually adjacent phases are spaced apart from each other by one data cycle;
an i-th (where i is an integer equal to or greater than 1 and less than n) clock signal of the multiphase clock signals being supplied as the second sampling control signal of an i-th sampling level converter circuit and an (i+1)th clock signal of the multiphase clock signals being supplied as the first sampling control signal;
a first latch circuit, which receives the terminal voltage of said first capacitor of said i-th sampling level converter circuit, for outputting this voltage in response to a transition to a first logic value of the (i+1)th clock signal and storing this voltage in response to a second logic value of the (i+1)th clock signal;
n-number of said first latches being provided corresponding to respective ones of said sampling level converter circuits; and
n-number of second latch circuits, to which outputs of respective ones of said first latch circuits are supplied, for receiving in common a latch timing signal having a cycle obtained by frequency-dividing the data cycle by n, and for latching and outputting outputs of said first latch circuits.

19. The circuit according to claim 15, wherein an amplitude voltage of the input signal supplied to the input terminal is less than the higher-potential power-supply voltage.

20. The circuit according to claim 15, wherein each of said switch elements and transistors comprising each of the circuits comprise thin-film transistors.

21. The circuit according to claim 17, wherein amplitude-voltage of the input signal supplied to the input terminal is less than the higher-potential power-supply voltage.

22. The circuits according to claim 17, wherein each of said switch elements and transistors comprising each of the circuits comprise thin-film transistors.

23. The circuit according to claim 18, wherein the circuit for generating the multiphase clocks signal comprises a shift register.

24. The circuit according to claim 18, wherein amplitude-voltage of the input signal supplied to the input terminal is less than the higher-potential power-supply voltage.

25. The circuits according to claim 18, wherein each of said switch elements and transistors comprising each of the circuits comprise thin-film transistors.

26. A sampling level converter circuit comprising:
first, second and third MOS transistors connected serially between a higher-potential power-supply and a lower-potential power-supply;
a first capacitor having one terminal connected to a connection node of said first and second MOS transistors and another terminal connected to the lower-potential power-supply;
a fourth MOS transistor connected between an input terminal, to which an input signal is supplied, and a gate terminal of said third MOS transistor; and
a second capacitor having one terminal connected to a connection node of the gate terminal of said third MOS transistor and said fourth MOS transistor and another terminal connected to the lower-potential power-supply;
wherein a first sampling control signal is supplied to gate terminals of respective ones of said first and second MOS transistors;
a second sampling control signal is supplied to a gate terminal of said fourth MOS transistor, wherein said input signal is sampled during a setup time-interval; and
an output signal is derived directly or indirectly from a terminal voltage of said first capacitor, wherein, during an output time-interval, said third switch element controls a discharging path for said first capacitor in accordance with a logic value of the input signal sampled during the setup time-interval.

27. A sampling level converter circuit comprising:
first, second and third MOS transistors connected serially between a higher-potential power-supply and a lower-potential power-supply;
a first capacitor having one terminal connected to a connection node of said first and second MOS transistors and another terminal connected to the lower-potential power-supply;
a fourth MOS transistor connected between an input terminal, to which an input signal is supplied, and a gate terminal of said second MOS transistor; and
a second capacitor having one terminal connected to a connection node of the gate terminal of said second MOS transistor and said fourth MOS transistor and another terminal connected to the lower-potential power-supply;
wherein a first sampling control signal is supplied to gate terminals of respective ones of said first and third MOS transistors;
a second sampling control signal is supplied to a gate terminal of said fourth MOS transistor, wherein said input signal is sampled during a setup time-interval; and
an output signal is derived directly or indirectly from a terminal voltage of said first capacitor, wherein, during an output time-interval, said third switch element controls a discharging path for said first capacitor in accordance with a logic value of the input signal sampled during the setup time-interval.

28. The circuit according to claim 26, wherein said first MOS transistor is of a first conductivity type and said second to fourth MOS transistors are of second conductivity type.

29. The circuit according to claim 2, wherein parasitic capacitors at said connection nodes are used respectively as said first and second capacitors.

30. A display device comprising:
a display panel having a display unit in which pixels are arranged in the form of matrix at cross points of a plurality of data lines and a plurality of scanning lines;
a scanning-line driver circuit for applying voltage sequentially to the plurality of scanning lines; and
a data-line driver circuit, for receiving display data from a host device, and for applying voltage corresponding to the display data to the plurality of data lines;
a display memory, provided externally of said display panel, for storing the display data; and
a controller, provided externally of said display panel, for controlling said display memory as well as communication with the host device;
said display panel having a sampling level converter circuit according to claim 1 as a level converter circuit which receives display data transferred from said display memory, for level-shifting the display data to a signal having a higher amplitude.

31. A display device comprising:
a display panel having a display unit in which pixels are arranged in the form of matrix at cross points of a plurality of data lines and a plurality of scanning lines;
a scanning-line driver circuit for applying voltage sequentially to the plurality of scanning lines; and
a data-line driver circuit, for receiving display data from a host device, and for applying voltage corresponding to the display data to the plurality of data lines;
a display memory, provided externally of said display panel, for storing the display data; and
a controller, provided externally of said display panel, for controlling said display memory as well as communication with the host device;
said display panel having a 2-phase expanding circuit according to claim 15 which receives display data transferred from said display memory, for level-shifting the display data to a signal having a higher amplitude.

32. A display device comprising:
a display panel having a display section in which pixels are arranged in the form of matrix at cross points of a plurality of data lines and a plurality of scanning lines;
a scanning-line driver circuit for applying voltage sequentially to the plurality of scanning lines; and
a data-line driver circuit, for receiving display data from a host device, and for applying voltage corresponding to the display data to the plurality of data lines;
a display memory, provided externally of said display panel, for storing the display data; and
a controller, provided externally of said display panel, for controlling said display memory as well as communication with the host device;
said display panel having an n-phase expanding circuit according to claim 18 which receives display data transferred from said display memory, for level-converting the display data to a signal having a higher amplitude.

33. The device according to claim 31, wherein a digital-to-analog converter for receiving an output from said 2-phase expanding circuit as an input is provided on said display panel.

34. The device according to claim 32, wherein a digital-to-analog converter for receiving an output from said n-phase expanding circuit as an input is provided on said display panel.

35. The circuit according to claim 27, wherein said first MOS transistor is of a first conductivity type and said second to fourth MOS transistors are of second conductivity type.

36. The circuit according to claim 26, wherein parasitic capacitors at said connection nodes are used respectively as said first and second capacitors.

37. The circuit according to claim 27, wherein parasitic capacitors at said connection nodes are used respectively as said first and second capacitors.

* * * * *